United States Patent
Kusayanagi et al.

(10) Patent No.: US 11,018,262 B2
(45) Date of Patent: May 25, 2021

(54) FIELD-EFFECT TRANSISTOR, METHOD FOR PRODUCING THE SAME, DISPLAY ELEMENT, IMAGE DISPLAY DEVICE, AND SYSTEM

(71) Applicants: Minehide Kusayanagi, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP)

(72) Inventors: Minehide Kusayanagi, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/318,597

(22) PCT Filed: Jul. 14, 2017

(86) PCT No.: PCT/JP2017/025827
§ 371 (c)(1),
(2) Date: Jan. 17, 2019

(87) PCT Pub. No.: WO2018/016456
PCT Pub. Date: Jan. 25, 2018

(65) Prior Publication Data
US 2019/0245090 A1    Aug. 8, 2019

(30) Foreign Application Priority Data

Jul. 20, 2016 (JP) .............................. JP2016-142511
Jun. 2, 2017 (JP) .............................. JP2017-109747

(51) Int. Cl.
*H01L 29/786* (2006.01)
*H01L 29/45* (2006.01)
*H01L 29/66* (2006.01)

(52) U.S. Cl.
CPC .......... *H01L 29/7869* (2013.01); *H01L 29/45* (2013.01); *H01L 29/458* (2013.01);
(Continued)

(58) Field of Classification Search
CPC .......... H01L 29/7869; H01L 29/78618; H01L 29/45; H01L 29/458
See application file for complete search history.

(56) References Cited

U.S. PATENT DOCUMENTS 5,943,105 A * 8/1999 Fujikawa .............. G02F 1/1362
349/39
9,527,285 B2   12/2016 Arae et al.
(Continued)

FOREIGN PATENT DOCUMENTS

JP   2003-273134 A   9/2003
JP   2011-216694 A   10/2011
(Continued)

OTHER PUBLICATIONS

International Search Report dated Sep. 26, 2017 in PCT/JP2017/025827 filed Jul. 14, 2017.
(Continued)

*Primary Examiner* — Michele Fan
(74) *Attorney, Agent, or Firm* — Oblon, McClelland, Maier & Neustadt, L.L.P.

(57) ABSTRACT

A field-effect transistor including: a gate electrode, which is configured to apply gate voltage; a source electrode and a drain electrode, which are configured to take electric current out; an active layer, which is disposed between the source electrode and the drain electrode and is formed of an oxide
(Continued)

semiconductor; and a gate insulating layer, which is disposed between the gate electrode and the active layer, the source electrode and the drain electrode each including a metal region formed of a metal and an oxide region formed of one or more metal oxides, and a part of the oxide region in each of the source electrode and the drain electrode being in contact with the active layer, and rest of the oxide region being in contact with one or more components other than the active layer.

19 Claims, 10 Drawing Sheets

(52) U.S. Cl.
CPC .. *H01L 29/66969* (2013.01); *H01L 29/78618* (2013.01); *H01L 29/78621* (2013.01)

(56) References Cited

U.S. PATENT DOCUMENTS

| | | | |
|---|---|---|---|
| 2004/0038446 A1 | 2/2004 | Takeda et al. | |
| 2008/0277663 A1* | 11/2008 | Kang | H01L 29/78606 257/57 |
| 2009/0242970 A1* | 10/2009 | Shimizu | H01L 29/66833 257/326 |
| 2009/0315026 A1* | 12/2009 | Jeong | H01L 29/45 257/43 |
| 2010/0051940 A1 | 3/2010 | Yamazaki et al. | |
| 2010/0090217 A1 | 4/2010 | Akimoto | |
| 2010/0224916 A1* | 9/2010 | Shimizu | H01L 21/28556 257/288 |
| 2011/0193050 A1* | 8/2011 | Takano | H01L 27/2409 257/4 |
| 2012/0171813 A1 | 7/2012 | Akimoto | |
| 2013/0045568 A1 | 2/2013 | Akimoto | |
| 2013/0181218 A1 | 7/2013 | Maeda et al. | |
| 2014/0167038 A1* | 6/2014 | Ahn | H01L 29/78696 257/43 |
| 2014/0361260 A1* | 12/2014 | Kim | H01L 27/3246 257/40 |
| 2015/0060790 A1* | 3/2015 | Kim | H01L 51/5246 257/40 |
| 2015/0070643 A1* | 3/2015 | Kim | H01L 27/1255 349/139 |
| 2015/0179683 A1* | 6/2015 | Le | H01L 21/02565 438/14 |
| 2015/0279674 A1* | 10/2015 | Cho | H01L 29/66969 257/43 |
| 2016/0013215 A1 | 1/2016 | Ueda et al. | |
| 2016/0013243 A1* | 1/2016 | O'Rourke | H01L 31/028 257/43 |
| 2016/0071889 A1 | 3/2016 | Yamazaki | |
| 2016/0190329 A1 | 6/2016 | Matsumoto et al. | |
| 2017/0018650 A1 | 1/2017 | Saotome et al. | |
| 2017/0033237 A1 | 2/2017 | Abe et al. | |
| 2017/0162601 A1 | 6/2017 | Arae et al. | |
| 2017/0323957 A1* | 11/2017 | Yamazaki | H01L 29/66969 |
| 2017/0345940 A1* | 11/2017 | Suzuki | G02F 1/1368 |
| 2018/0233543 A1* | 8/2018 | Hong | H01L 51/5218 |

FOREIGN PATENT DOCUMENTS

| | | |
|---|---|---|
| JP | 2012-94853 A | 5/2012 |
| JP | 2012-222171 A | 11/2012 |
| JP | 5274147 B2 | 5/2013 |
| JP | 2014-160818 A | 9/2014 |
| JP | 2015-046568 A | 3/2015 |
| JP | 2016-28412 A | 2/2016 |

OTHER PUBLICATIONS

Written Opinion dated Sep. 26, 2017 in PCT/JP2017/025827 filed Jul. 14, 2017.
Korean Office Action dated Jul. 27, 2020 in Korean Patent Application No. 10-2019-7004462 (with English language translation), 17 pages.
Office Action dated Mar. 9, 2021, in Japanese. Patent Application No. 2017-109747 filed Jun. 2, 2017 (With English translation).

* cited by examiner

[Fig. 1]
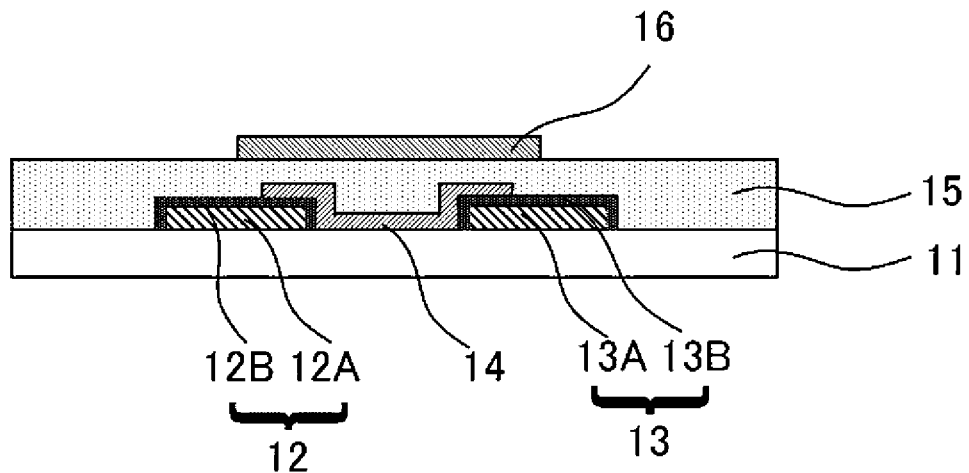
[Fig. 2]
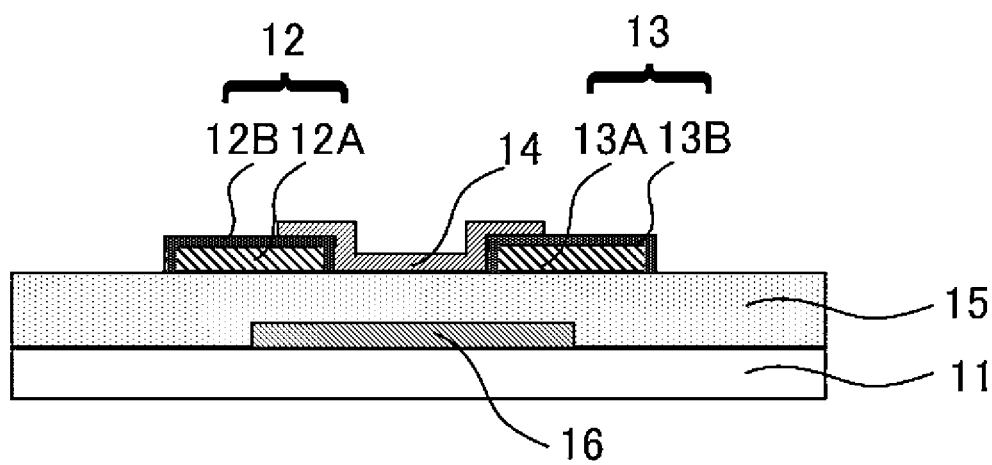
[Fig. 3A]
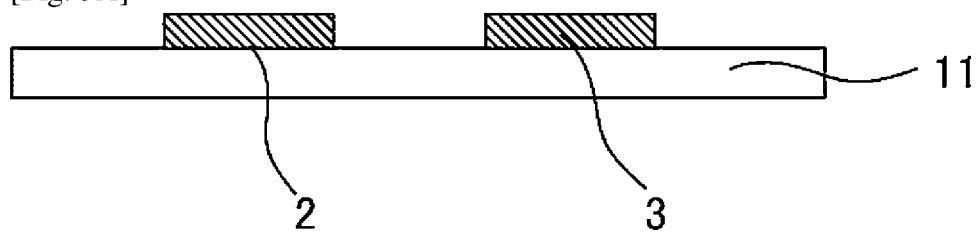
[Fig. 3B]
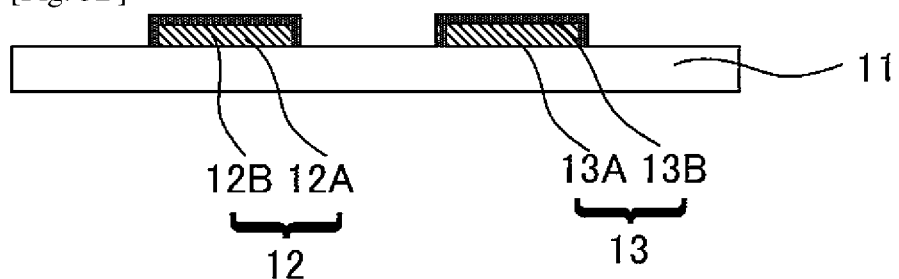

[Fig. 3C]
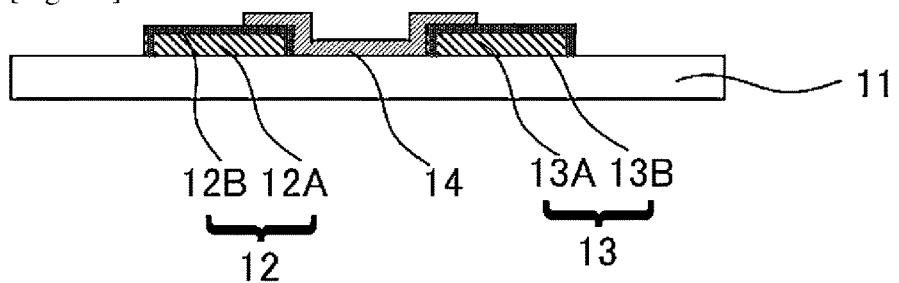
[Fig. 3D]
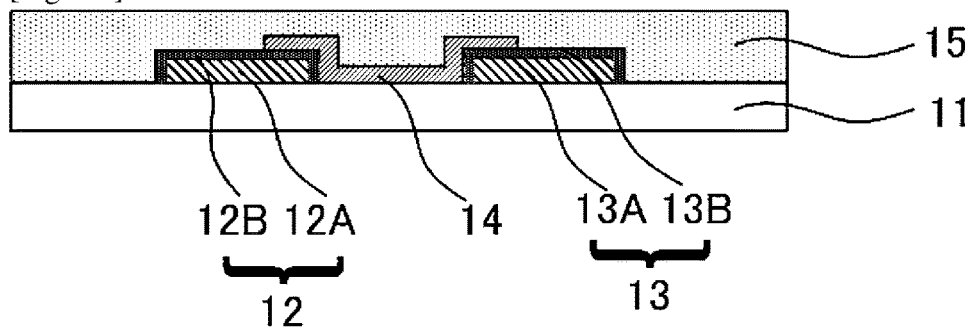
[Fig. 3E]
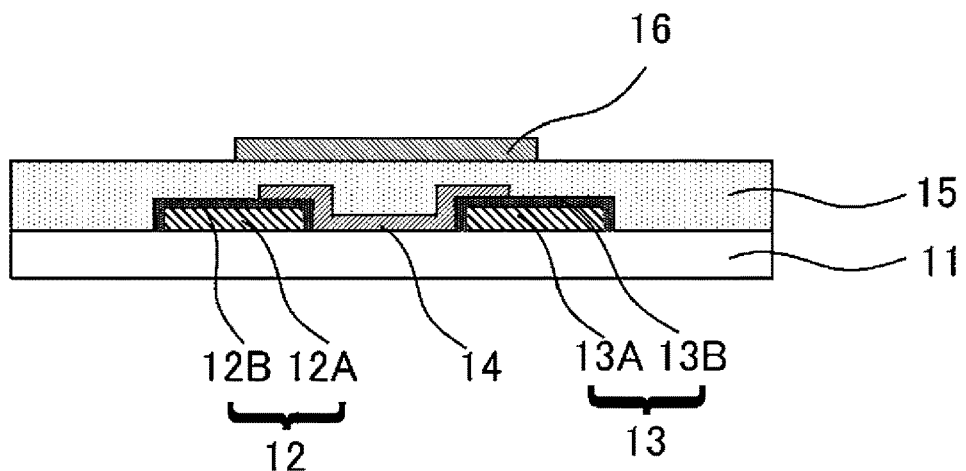
[Fig. 4]
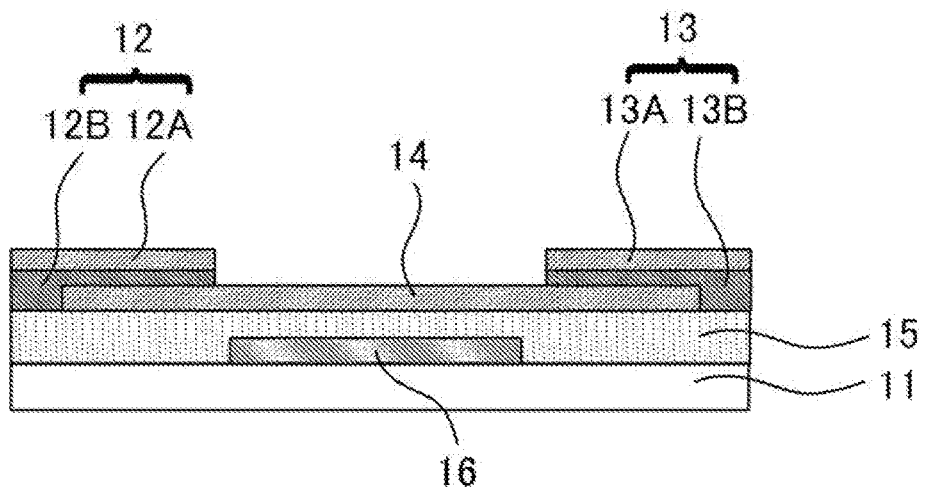

[Fig. 5]
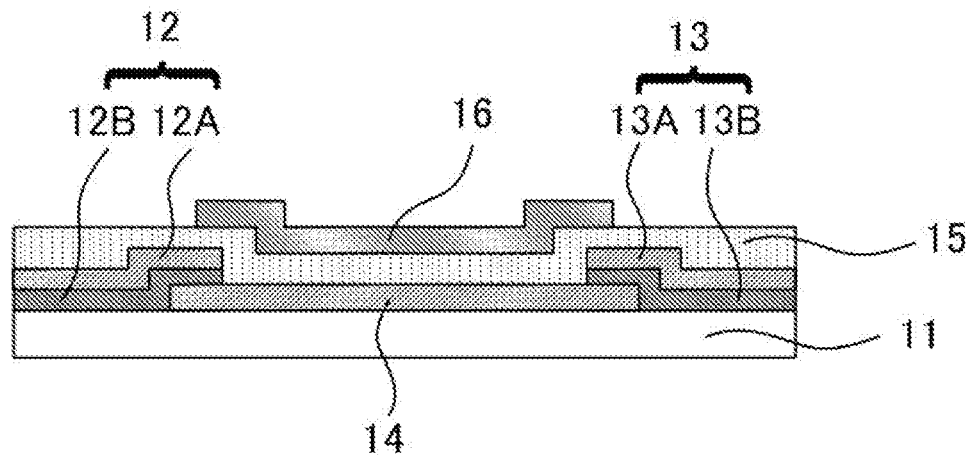
[Fig. 6]
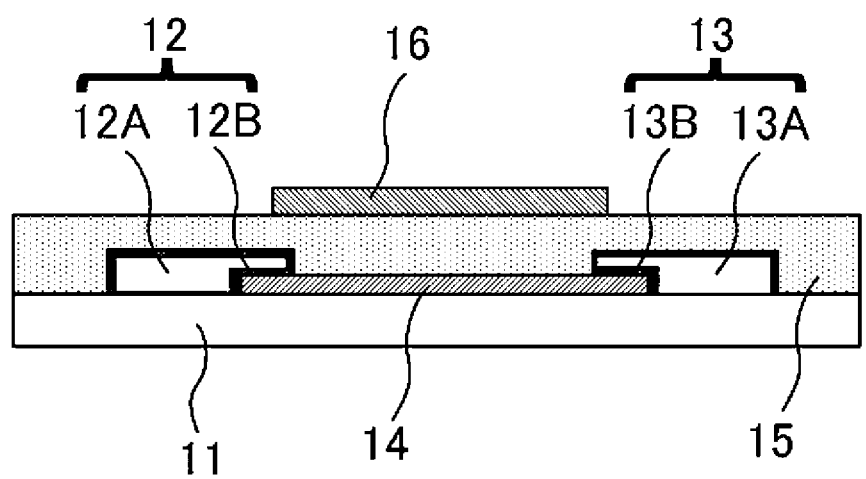
[Fig. 7]
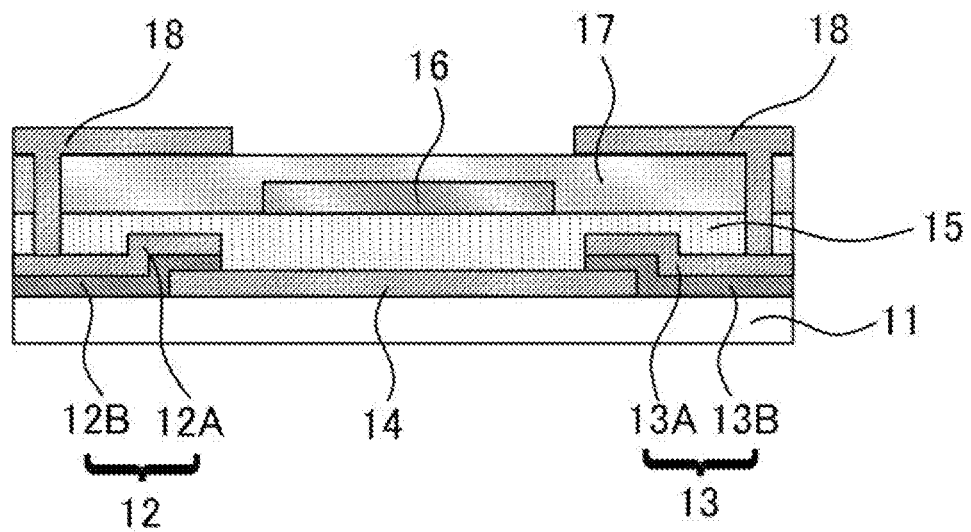

[Fig. 8]
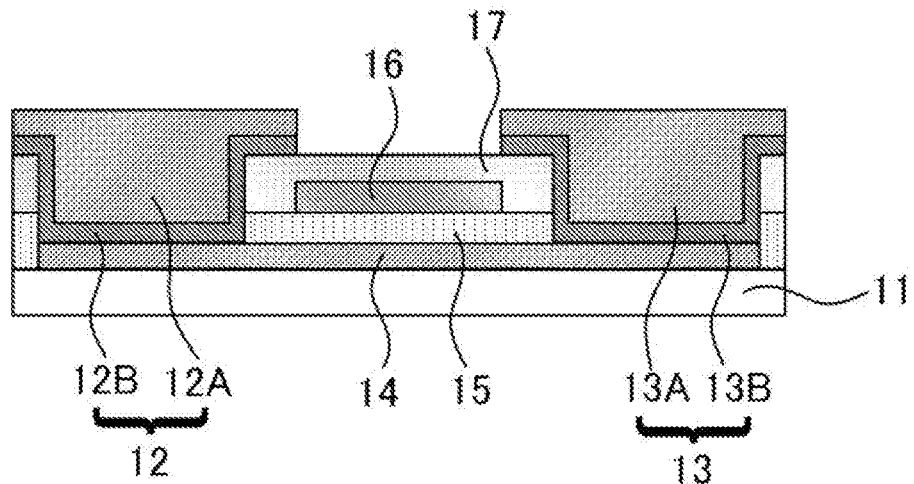
[Fig. 9]
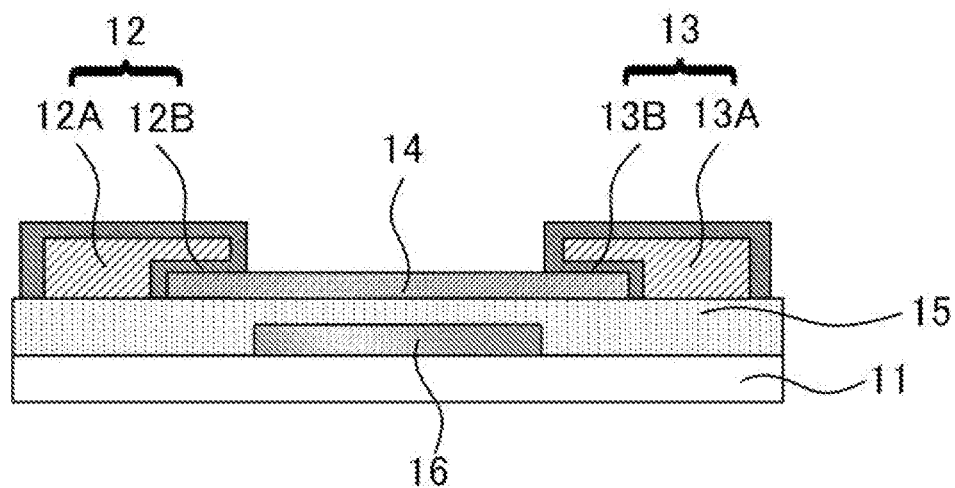
[Fig. 10]
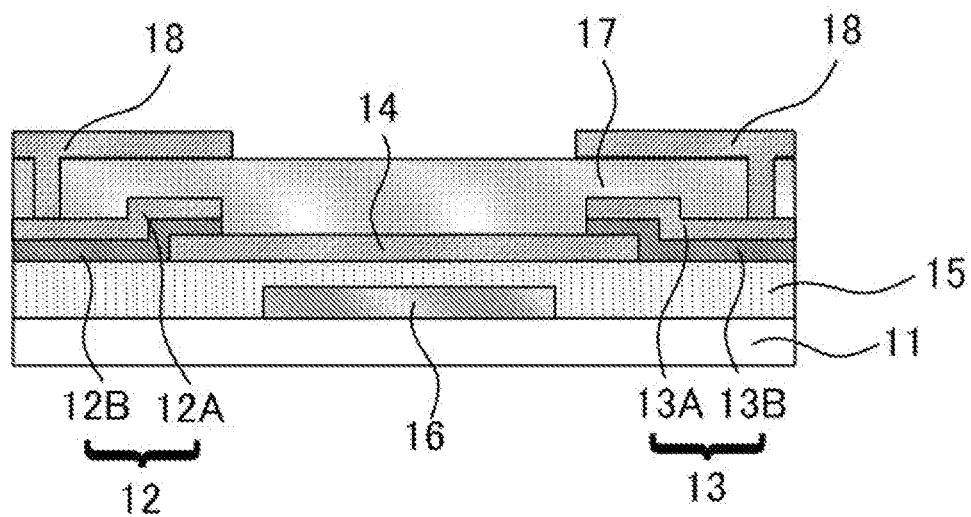

[Fig. 11]
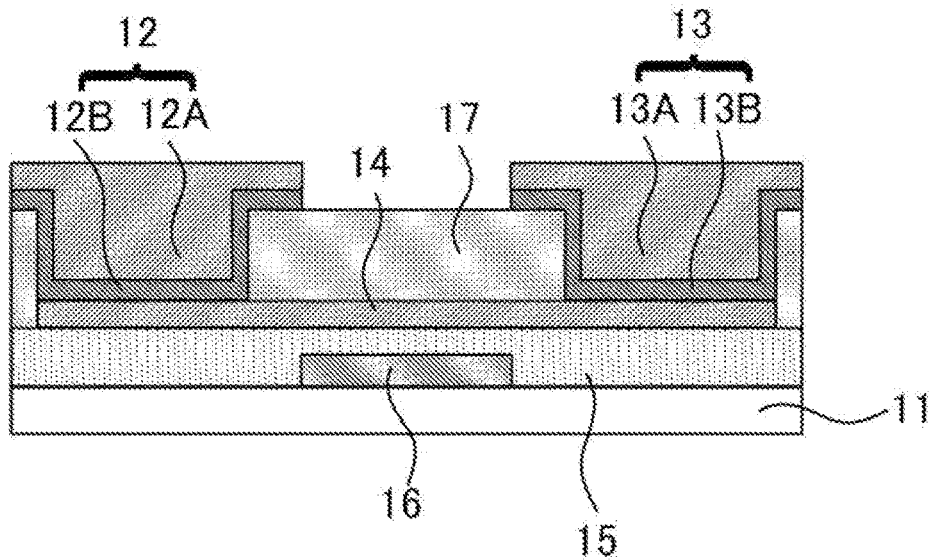
[Fig. 12]
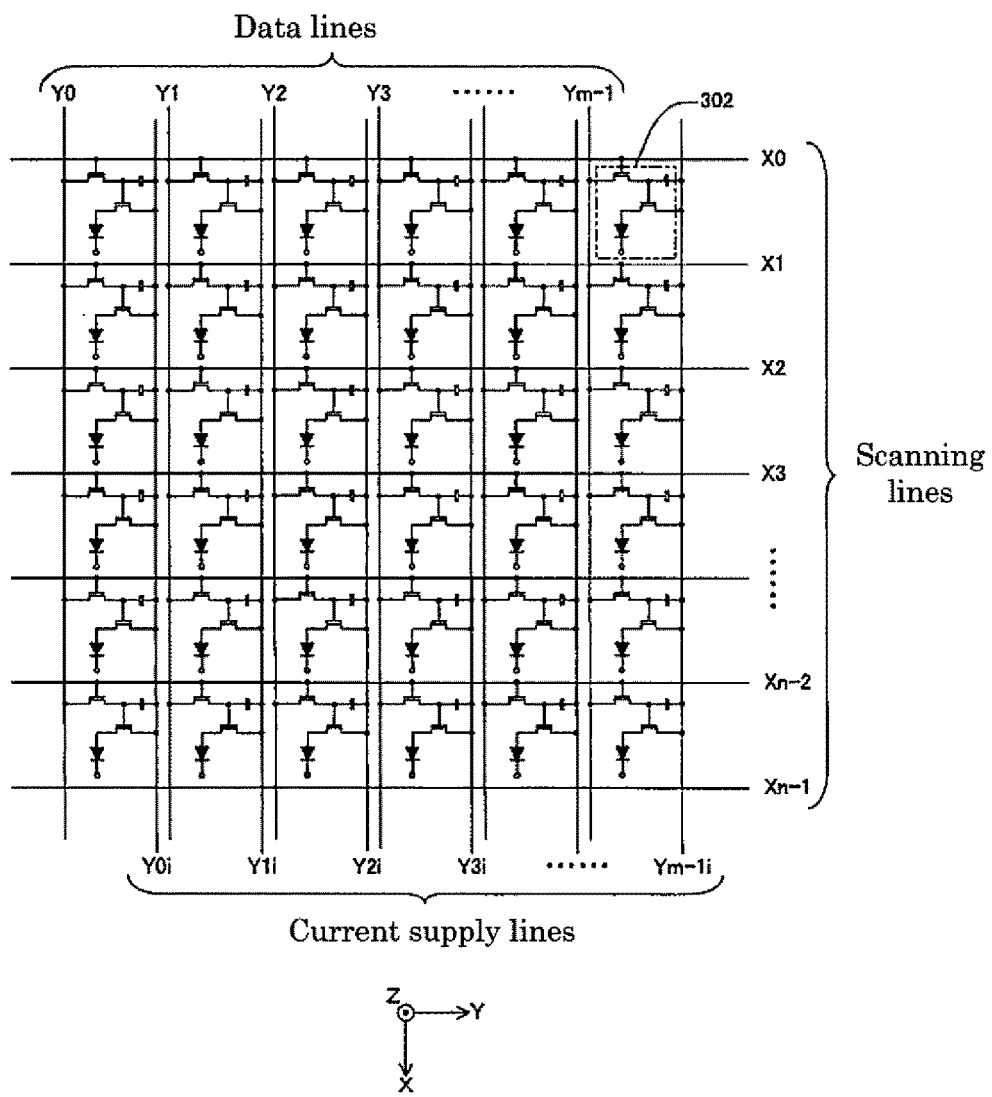

[Fig. 13]
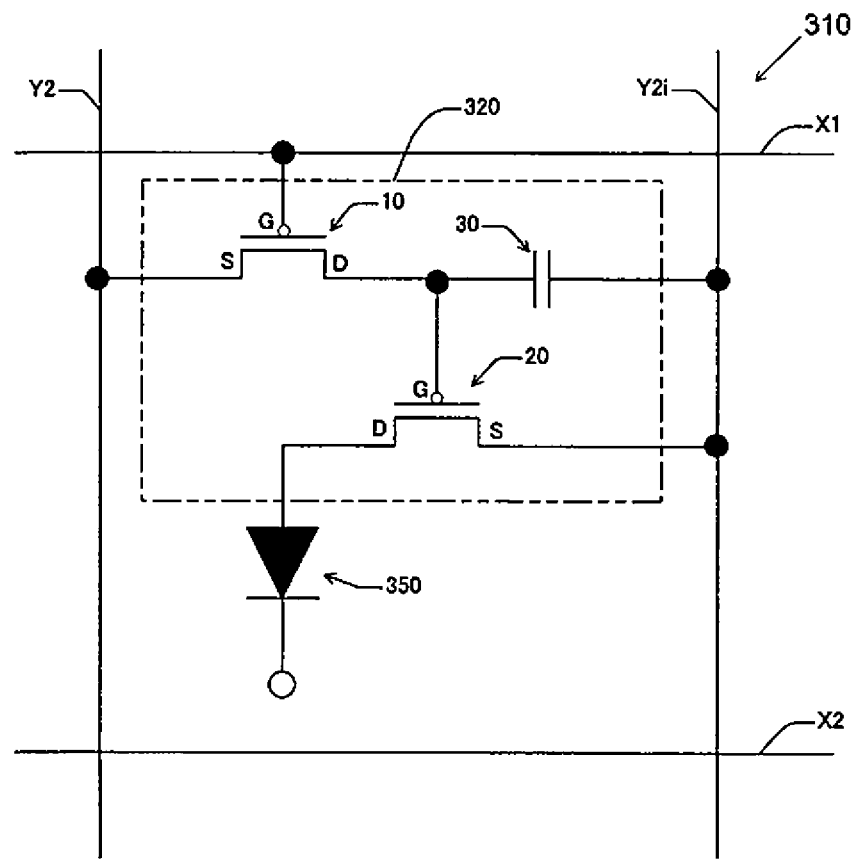
[Fig. 14]
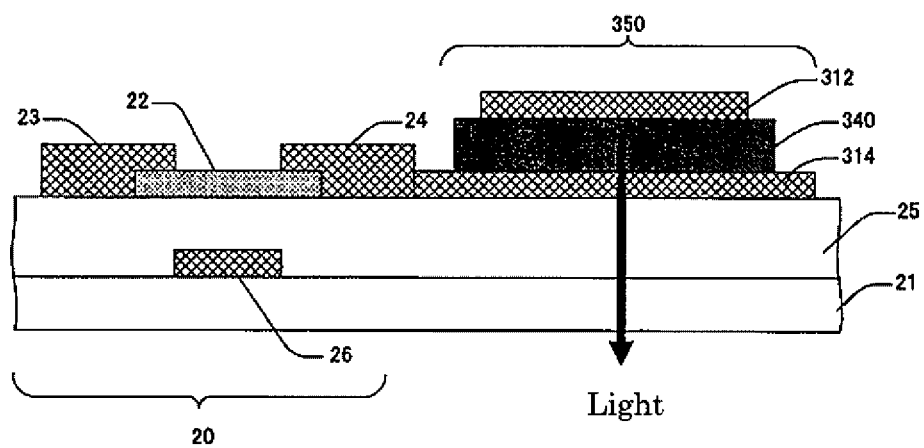

[Fig. 15]
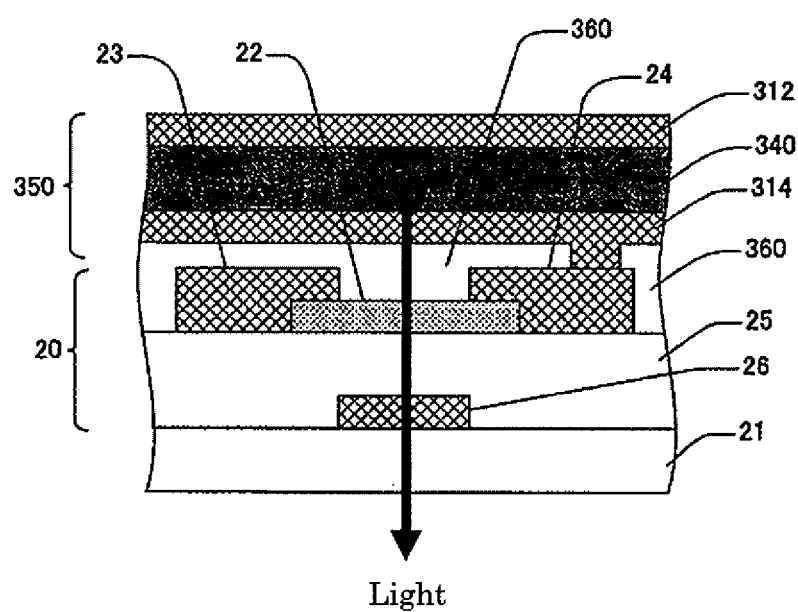
Light
[Fig. 16]
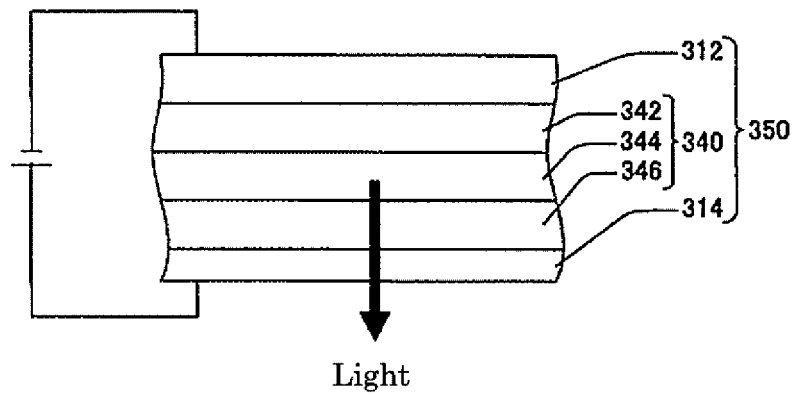
Light

[Fig. 17]
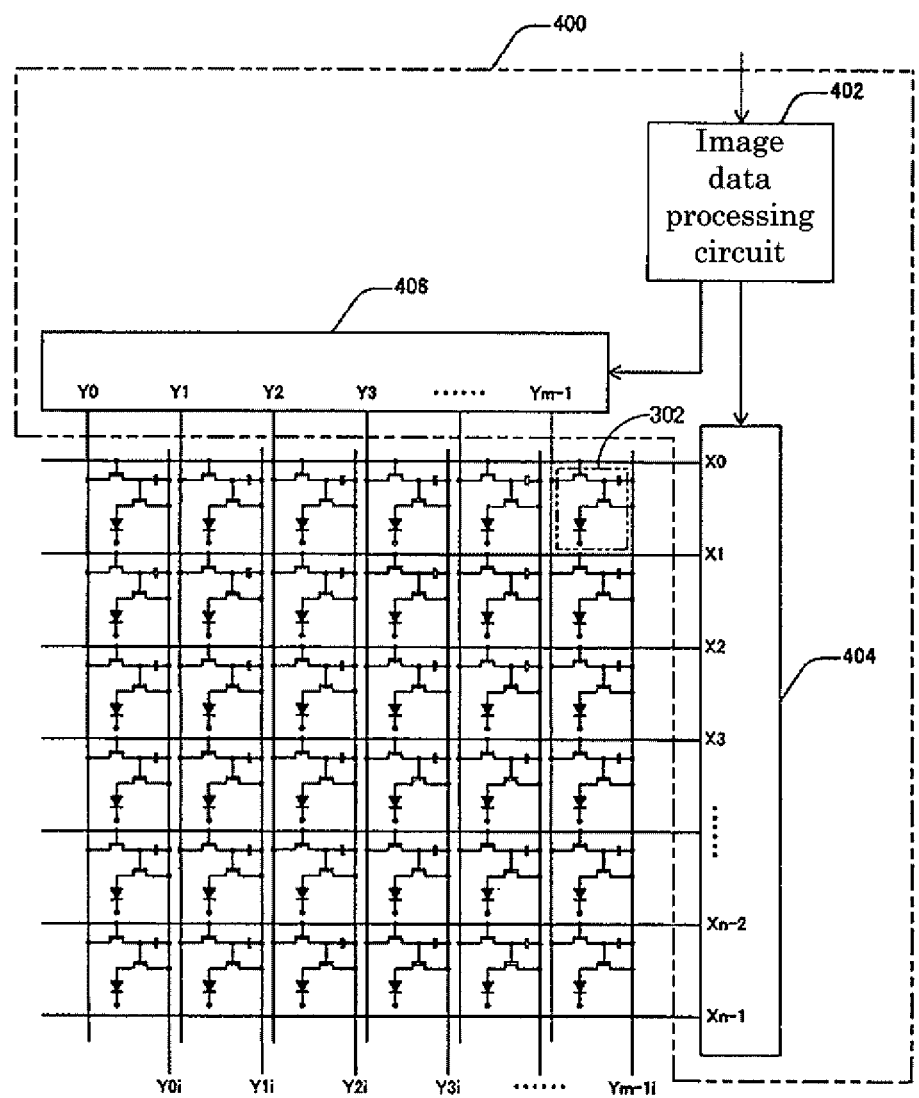

[Fig. 18]
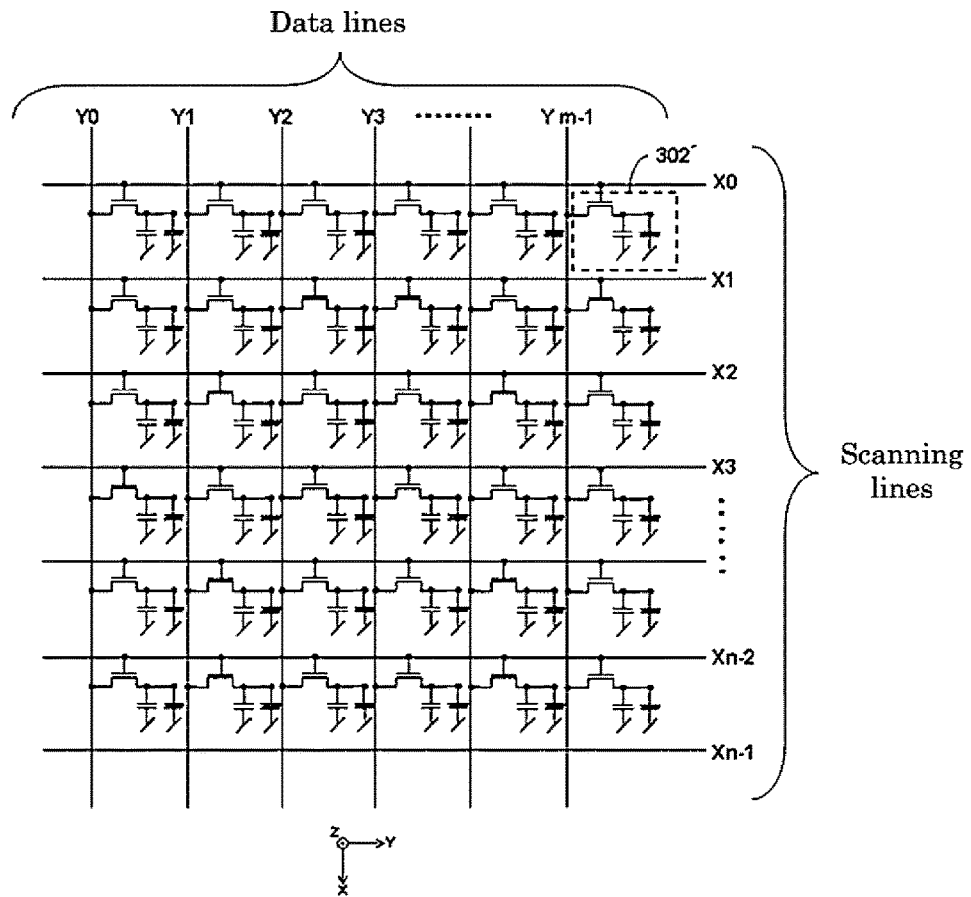
[Fig. 19]
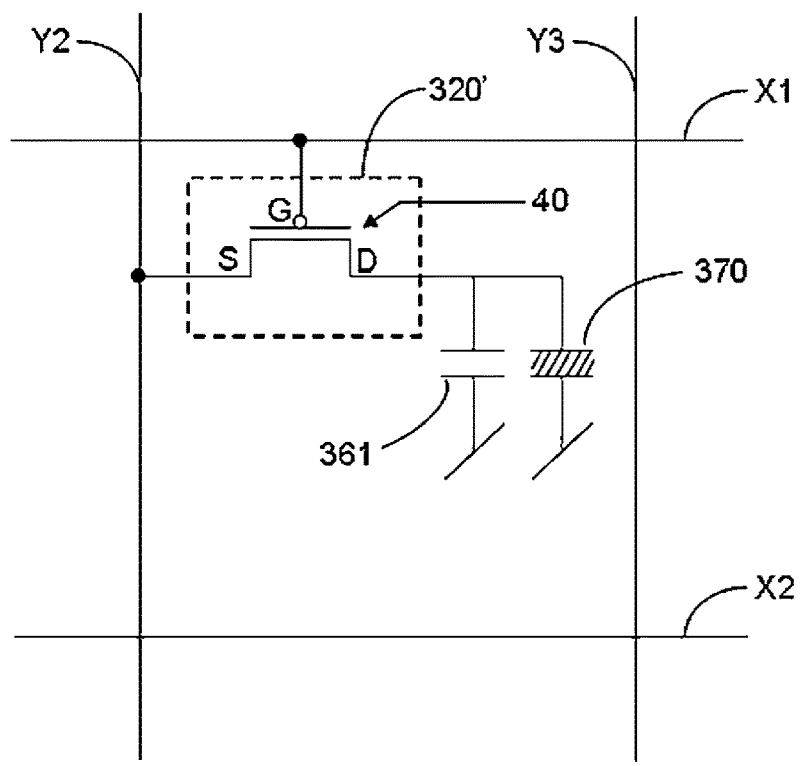

[Fig. 20]
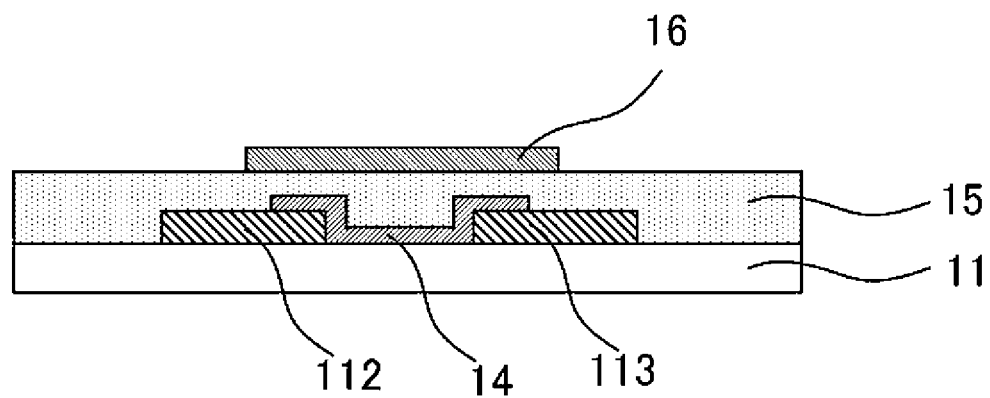
[Fig. 21]
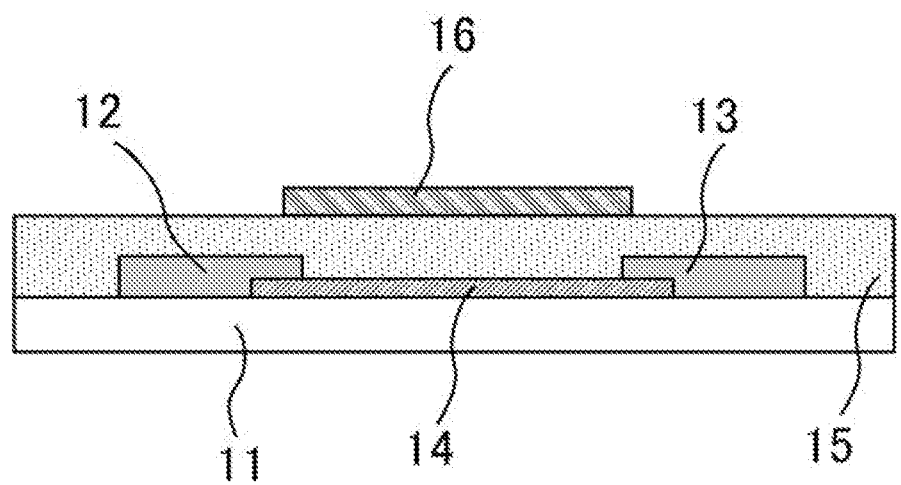

FIELD-EFFECT TRANSISTOR, METHOD FOR PRODUCING THE SAME, DISPLAY ELEMENT, IMAGE DISPLAY DEVICE, AND SYSTEM

TECHNICAL FIELD

The present disclosure relates to a field-effect transistor, a method for producing the same, a display element, an image display device, and a system.

BACKGROUND ART

Flat panel displays (FPDs) such as liquid crystal displays (LCDs), organic EL (electroluminescence) displays (OLEDs), and electronic papers are driven by a driving circuit including a thin film transistor (TFT) in which an amorphous silicon or a poly-crystalline silicon is used as an active layer.

In the development of FPDs, there has been attention to produce a TFT including a field-effect transistor, which includes, on a channel forming area of the active layer, an oxide semiconductor film having high carrier mobility and small unevenness between the elements, and to apply the TFT to electric devices or optical devices.

In a field-effect transistor including an oxide semiconductor serving as an active layer, a stacked metal film of Al and a barrier layer including a transition metal (Mo, Ti, or an alloy thereof), which is a typical metal material, may be used for materials for the source electrode and the drain electrode (for example, see PTL 1). In that case, there is concern that the resultant transistor becomes a normally-on field-effect transistor where even when gate voltage of the transistor is not applied, a large quantity of electric current flows between the source electrode and the drain electrode.

CITATION LIST

Patent Literature

PTL 1: Japanese Unexamined Patent Application Publication No. 2011-216694

SUMMARY OF INVENTION

Technical Problem

The present disclosure has an object to provide a field-effect transistor which prevents an oxide semiconductor to be an active layer from being reduced between an interface of the oxide semiconductor with a source electrode and an interface of the oxide semiconductor with a drain electrode, and has a simple configuration and favorable transistor characteristics.

Solution to Problem

Means for solving the aforementioned problems are as follows. That is, a field-effect transistor of the present disclosure includes: a gate electrode, which is configured to apply gate voltage; a source electrode and a drain electrode, which are configured to take electric current out; an active layer, which is disposed between the source electrode and the drain electrode and is formed of an oxide semiconductor; and a gate insulating layer, which is disposed between the gate electrode and the active layer. The source electrode and the drain electrode each include a metal region formed of a metal and an oxide region formed of one or more metal oxides. A part of the oxide region in each of the source electrode and the drain electrode is in contact with the active layer, and the rest of the oxide region is in contact with one or more components other than the active layer.

Advantageous Effects of Invention

According to the present disclosure, it is possible to provide a field-effect transistor which prevents an oxide semiconductor to be an active layer from being reduced between an interface of the oxide semiconductor with a source electrode and an interface of the oxide semiconductor with a drain electrode, and has a simple configuration and favorable transistor characteristics.

BRIEF DESCRIPTION OF DRAWINGS

FIG. 1 is a schematic structural view illustrating one example of a field-effect transistor of the present disclosure.

FIG. 2 is a schematic structural view illustrating another example of a field-effect transistor of the present disclosure.

FIG. 3A is a schematic cross-sectional view illustrating a method for producing a field-effect transistor of the present disclosure (part 1).

FIG. 3B is a schematic cross-sectional view illustrating a method for producing a field-effect transistor of the present disclosure (part 2).

FIG. 3C is a schematic cross-sectional view illustrating a method for producing a field-effect transistor of the present disclosure (part 3).

FIG. 3D is a schematic cross-sectional view illustrating a method for producing a field-effect transistor of the present disclosure (part 4).

FIG. 3E is a schematic cross-sectional view illustrating a method for producing a field-effect transistor of the present disclosure (part 5).

FIG. 4 is a schematic structural view illustrating another example of a field-effect transistor of the present disclosure.

FIG. 5 is a schematic structural view illustrating another example of a field-effect transistor of the present disclosure.

FIG. 6 is a schematic structural view illustrating another example of a field-effect transistor of the present disclosure.

FIG. 7 is a schematic structural view illustrating another example of a field-effect transistor of the present disclosure.

FIG. 8 is a schematic structural view illustrating another example of a field-effect transistor of the present disclosure.

FIG. 9 is a schematic structural view illustrating another example of a field-effect transistor of the present disclosure provided as a modification example of FIG. 6.

FIG. 10 is a schematic structural view illustrating another example of a field-effect transistor of the present disclosure provided as a modification example of FIG. 7.

FIG. 11 is a schematic structural view illustrating another example of a field-effect transistor of the present disclosure provided as a modification example of FIG. 8.

FIG. 12 is a diagram for presenting an image display device.

FIG. 13 is a diagram for presenting one example of a display element of the present disclosure.

FIG. 14 is a schematic structural view illustrating one example of a positional relationship between an organic EL element and a field-effect transistor in a display element.

FIG. 15 is a schematic structural view illustrating another example of a positional relationship between an organic EL element and a field-effect transistor in a display element.

FIG. 16 is a schematic structural view illustrating one example of an organic EL element.

FIG. 17 is a diagram for presenting a display control device.

FIG. 18 is a diagram for presenting a liquid crystal display.

FIG. 19 is a diagram for presenting a display element in FIG. 18.

FIG. 20 is a schematic structural view illustrating a field-effect transistor of Comparative Example 1.

FIG. 21 is a schematic structural view illustrating a field-effect transistor of Comparative Example 2.

DESCRIPTION OF EMBODIMENTS

In the field-effect transistor, it is known that when the oxide semiconductor serving as the active layer has an electron carrier concentration of from $1\times10^{15}$ cm$^{-3}$ through $1\times10^{16}$ cm$^{-3}$ and a metal (for example, Al) having a low work function is used as the source electrode and the drain electrode, obtained transistor characteristics are high field-effect mobility, high on/off ratio and a small absolute value of the rising voltage.

Meanwhile, when the electron carrier concentration is $1.0\times10^{18}$ cm$^{-3}$ or more, obtained transistor characteristics are small on/off ratio and a large absolute value of the rising voltage (for example, see Japanese Unexamined Patent Application Publication No. 2010-62546).

In addition, it is reported that even when the electron carrier concentration is $1\times10^{18}$ cm$^{-3}$ or more, incorporation of a metal (for example, Au having a deep work function) into the source electrode and the drain electrode makes it possible to obtain such transistor characteristics as high field-effect mobility, high on/off ratio, and a small absolute value of the rising voltage (for example, see Japanese Unexamined Patent Application Publication No. 2015-046568).

As mentioned above, when the electron carrier concentration of the oxide semiconductor is controlled to a desired value and suitable materials are selected for the source electrode and the drain electrode, it is possible to obtain such transistor characteristics as high field-effect mobility, high on/off ratio, and a small absolute value of the rising voltage.

However, even when the electron carrier concentration of the oxide semiconductor is controlled to the desired value as described above to form the active layer, unless such a metal that is not oxidized (e.g., Au or Pt) is used as the source electrode and the drain electrode, the following phenomenon will occur. That is, in a contact interface between the oxide semiconductor and each of the drain electrode and the source electrode, the metal material to be an electrode deprives the oxide semiconductor of oxygen atoms, and thus oxygen vacancies form in the oxide semiconductor to increase the electron carrier concentration of the oxide semiconductor. This may cause unevenness and deterioration of the transistor characteristics in the field-effect transistor using the active layer, the oxide semiconductor that mainly uses the oxygen vacancies as the sources of carrier generation.

For example, in a field-effect transistor using an oxide semiconductor in an active later, a transition metal (e.g., Mo), which is not a chemically stable metal unlike Au, Pt, and other chemically stable metals, is used for materials of the source electrode and the drain electrode in some cases. In this case, in a region in contact with the oxide semiconductor, the electrode deprives the oxide semiconductor of oxygen atoms, resulting in reduction of the oxide semiconductor. The reduction of the oxide semiconductor causes oxygen vacancies of the oxide semiconductor, resulting in an increase in the electron carrier concentration. As a result, there is a concern that the resultant transistor becomes a normally-on field-effect transistor where even when gate voltage of the transistor is not applied, a large quantity of electric current flows between the source electrode and the drain electrode.

Under such circumstances, the present inventors conducted extensive studies. The present inventors have found that it is possible to prevent the oxide semiconductor from being reduced due to a metallic source electrode and a metallic drain electrode by oxidizing the surfaces of the source electrode and the drain electrode and oxidizing a part of the source electrode and a part of the drain electrode, which are in contact with the active layer. As a result, the present inventors have completed the present invention.

(Field-Effect Transistor)

A field-effect transistor of the present disclosure includes a gate electrode, a source electrode, a drain electrode, an active layer, and a gate insulating layer, further includes other components if necessary.

<Gate Electrode>

The gate electrode is not particularly limited and may be appropriately selected depending on the intended purpose so long as it is an electrode configured to apply gate voltage.

A material of the gate electrode is not particularly limited and may be appropriately selected depending on the intended purpose. Examples of the material of the gate electrode include metals (e.g., Al, platinum (Pt), palladium (Pd), gold (Au), silver (Ag), Cu, zinc (Zn), Ni, Cr, Ta, Mo, and Ti), alloys of the metals, and mixtures of these metals. The material of the gate electrode may be conductive oxides (e.g., indium oxide, zinc oxide, tin oxide, gallium oxide, and niobium oxide), composite compounds thereof, and mixtures thereof.

An average thickness of the gate electrode is not particularly limited and may be appropriately selected depending on the intended purpose. The average thickness of the gate electrode is preferably from 10 nm through 1 micrometer, more preferably from 50 nm through 300 nm.

<Source Electrode and Drain Electrode>

The source electrode and the drain electrode are electrodes configured to take electric current out.

The source electrode and the drain electrode are formed so that a predetermined interval is disposed between the source electrode and the drain electrode.

The source electrode and the drain electrode each include a metal region formed of a metal and an oxide region formed of one or more metal oxides.

A part of the oxide region in each of the source electrode and the drain electrode is in contact with the active layer, and the rest of the oxide region is in contact with one or more components other than the active layer.

When the part of the oxide region is in contact with the active layer, the metal included in the source electrode and the drain electrode prevents the active layer in the oxide semiconductor from being reduced. As a result, the oxide semiconductor can be prevented from an undesired increase in electron carrier concentration.

The oxygen concentration in a region of the oxide region in each of the source electrode and the drain electrode decreases toward, for example, the metal region, the region of the oxide region in each of the source electrode and the drain electrode being in contact with the active layer. This change in the oxygen concentration arises due to oxidization of the surface of the metal.

The oxygen concentration can be confirmed through TEM-EDX (energy dispersive X-ray spectroscopy) or by measuring the depth profile through X-ray photoelectron spectroscopy.

The metal is preferably a transition metal (simple substance) or an alloy thereof in terms of stability as the metal wired line.

The oxides of the oxide region are more preferably a conductive oxide in order to decrease contact resistance with the active layer. The metal forming the metal regions of the source electrode and the drain electrode is preferably an element capable of forming a conductive oxide upon forming the oxides.

The metal preferably includes at least one selected from the group consisting of Ti, Cu, Ni, Cr, V, Nb, Ta, Mo, and W because the oxygen concentration of the oxide region can be controlled when the conductive oxide is formed. The one or more metal oxides forming the oxide region may not satisfy stoichiometry.

It is preferable that the oxide regions be formed on the surface of the source electrode and that of the drain electrode in terms of durability to wet-etching in the post-process. Formation of the oxide region over the whole surface of the source electrode and that of the drain electrode makes it possible to sufficiently increase a selection ratio between etching rates for the source electrode and the drain electrode with respect to an etching solution for wet-etching to be used in the post-process. For example, it is known that Ti is subjected to etching with a fluorinated acid-based etching solution. However, when a film of an insulating layer including $SiO_2$, which is to be subjected to etching with fluorinated acid likewise, is formed on the Ti, a sufficient selection ratio of the etching cannot be obtained. However, formation of the oxide region makes it possible to increase the selection ratio of the etching because a surface of the Ti becomes titanium oxide.

In addition, in terms of close adhesiveness to the bottom ground and the upper layer, when components other than the active layer, which are in contact with the source electrode and the drain electrode, are formed of oxide, the close adhesiveness to the components other than the active layer is improved by forming the oxide region on a metal to be formed into the source electrode and the drain electrode. Therefore, it is preferable that the oxide region be formed on the metal to be formed into the source electrode and the drain electrode.

The source electrode and the drain electrode each may have a stacked structure of a first layer and a second layer, the first layer including the metal region and the oxide region and the second layer being formed of a metal.

In that case, the second layer preferably has a higher electric conductivity than that of the metal region of the first layer. As a result, it is possible to decrease wiring resistance.

The metal of the second layer is not particularly limited and may be appropriately selected depending on the intended purpose. Examples of the metal of the second layer include simple substances of the transition metal, alloys of the transition metal, simple substances of the typical metal, and alloys of the typical metal.

The oxides include a transition metal having a positive valence and a substitutional dopant having a positive valence larger than the positive valence of the transition metal. The metal preferably includes an element of the transition metal and an element serving as a dopant with respect to the oxides. In this case, the oxides are improved in electric conductivity.

Examples of the element serving as a dopant with respect to the oxides include a second metal element such as Group (n+1) elements and Group (n+2) [i.e., Group (n+1) or more element] elements, where the n is the Group number in the periodic table of a first transition metal element.

The element of the transition metal preferably includes at least one selected from the group consisting of Ti, V, Nb, Ta, Mo, and W.

The element serving as a dopant with respect to the oxides preferably includes at least one selected from the group consisting of V, Nb, Ta, Cr, Mo, W, Mn, and Re.

When the oxide is an oxide undergoing a substitutional doping where a pentavalent Nb is substituted with a tetravalent Ti, resistivity can be decreased compared to the adjacent active layer, which makes it possible to decrease contact resistivity between the active layer and the source electrode and contact resistivity between the active layer and the drain electrode.

An amount of the substitutional dopant with respect to the oxides is not particularly limited and may be appropriately selected depending on the intended purpose. The amount of the substitutional dopant is preferably from 0.01 atom % through 20 atom %, more preferably from 0.1 atom % through 10 atom % relative to an amount of the transition metal in terms of generation of carriers and a scattering factor of the generated carriers.

An average thickness of the oxide region is not particularly limited and may be appropriately selected depending on the intended purpose. However, the average thickness of the oxide region is preferably thinner than an average thickness of the metal region.

The average thickness of the oxide region is not particularly limited and may be appropriately selected depending on the intended purpose, but the average thickness of the oxide region is preferably from 1 nm through 50 nm.

In the bottom contact field-effect transistor, presence of the oxide region can be confirmed, for example, by simply evaluating the work function through photoelectron spectroscopy in the air. In the top contact field-effect transistor, the presence of the oxide region can be confirmed through TEM-EDX (energy dispersive X-ray spectroscopy) or by measuring the depth profile through X-ray photoelectron spectroscopy.

The work function of the oxide region is larger than the work function of the metal region.

An average thickness of the source electrode and an average thickness of the drain electrode are not particularly limited and may be appropriately selected depending on the intended purpose, but are preferably from 10 nm through 1 micrometer, more preferably from 50 nm through 300 nm.

<Active Layer>

The active layer is formed of an oxide semiconductor.

The active layer is disposed between the source electrode and the drain electrode.

The active layer positioned between the source electrode and the drain electrode is a channel region.

The oxide semiconductor preferably includes at least one selected from the group consisting of In, Zn, Sn, and Ti.

The oxide semiconductor preferably includes at least one of alkaline earth elements.

The oxide semiconductor preferably includes at least one of rare earth elements.

Examples of the oxide semiconductor include an n-type oxide semiconductor.

The n-type oxide semiconductor is not particularly limited and may be appropriately selected depending on the intended purpose. However, the n-type oxide semiconductor preferably includes at least one selected from the group consisting of indium, zinc, tin, gallium, and titanium.

Examples of the n-type oxide semiconductor include ZnO, $SnO_2$, $In_2O_3$, $TiO_2$, and $Ga_2O_3$. Moreover, oxides including a plurality of metals (e.g., In—Zn-based oxides, In—Sn-based oxides, In—Ga-based oxides, Sn—Zn-based oxides, Sn—Ga-based oxides, Zn—Ga-based oxides, In—Zn—Sn-based oxides, In—Ga—Zn-based oxides, In—Sn—Ga-based oxides, Sn—Ga—Zn-based oxides, In—Al—Zn-based oxides, Al—Ga—Zn-based oxides, Sn—Al—Zn-based oxides, In—Hf—Zn-based oxides, and In—Al—Ga—Zn-based oxides) can be used.

Moreover, it is preferable that the n-type oxide semiconductor undergo substitutional doping with at least one dopant selected from the group consisting of a divalent cation, a trivalent cation, a tetravalent cation, a pentavalent cation, a hexavalent cation, a heptavalent cation, and an octavalent cation, and a valence of the dopant be more than a valence of a metal ion constituting the n-type oxide semiconductor, provided that the dopant is excluded from the metal ion. Here, the substitutional doping may be referred to as n-type doping.

In the n-type oxide semiconductor subjected to substitutional doping, part of the metal ions constituting the n-type oxide semiconductor, which is a mother phase, is substituted with a dopant having a higher valence than the valence of the metal ion, and extra electrons generated because of a difference in valence are released to serve as n-type conductive carriers. In a case where the carrier electrons generated by the substitutional doping are responsible for semiconductor characteristics, the semiconductor characteristics become more stable. The reason for this is as follows. Specifically, the number of carrier electrons attributed to oxygen vacancies are easily changed by undergoing influences (e.g., oxidation-reduction reactions and adsorption of oxygen onto a surface of the film) when oxygen is exchanged between the semiconductor and the exterior (the atmosphere or the adjacent layer). Meanwhile, the number of carrier electrons attributed to substitutional doping is relatively free from an influence of such changes in the state.

Moreover, the number of carrier electrons attributed to substitutional doping can be favorably controlled, and a desired carrier concentration can be easily achieved, which is one advantage. As described above, oxygen relatively easily moves in and out of the semiconductor, and thus it is difficult to accurately control an amount of oxygen or maintain the amount of oxygen to a predetermined value. Meanwhile, the number of the carrier electrons attributed to the substitutional doping can be easily and accurately controlled by appropriately selecting a kind of the dopant element and a doping amount.

In order to decrease oxygen vacancies in the active layer, it is effective to introduce more oxygen atoms into the film during the film formation process of the n-type oxide semiconductor layer (active layer). For example, in a case where the n-type oxide semiconductor layer is formed by a sputtering method, a film having less oxygen vacancies can be formed by increasing the oxygen concentration in the atmosphere during the sputtering. Alternatively, in a case where the n-type oxide semiconductor layer is formed by coating and baking the coating liquid, a film having less oxygen vacancies can be formed by increasing the oxygen concentration in the atmosphere during the baking.

Moreover, an amount of the oxygen vacancies can be decreased depending on the formulation of the n-type oxide semiconductor. For example, generation of oxygen vacancies can be suppressed by introducing a certain amount of a metal element having high affinity to oxygen (e.g., Si, Ge, Zr, Hf, Al, Ga, Sc, Y, Ln, and alkaline earth metals).

The kind of the dopant is preferably selected depending on an ionic radius, the number of coordination, and an orbital energy. A concentration of the dopant may be appropriately selected depending on a material of the mother phase, the kind of the dopant, a site to be substituted by the dopant, a film formation process, and desired transistor characteristics.

Theoretically, the number of electrons generated when one atom is substituted is a value obtained by subtracting a valence of a metal atom of a mother phase constituting the n-type oxide semiconductor from a valence of a cation (i.e., dopant). That is, the valence of the dopant is preferably large in order to generate the same number of electrons in a smaller doping amount. Moreover, a difference between the valence of the dopant and the valence of the metal atom constituting the n-type oxide semiconductor is preferably larger. When the dopants are excessively present, crystal structures and alignments of atoms are disturbed, which prevents carrier electrons from movements. Accordingly, a preferable embodiment is to generate a necessary and sufficient amount of carrier electrons in as small a doping amount as possible.

Moreover, a preferable embodiment is that a selected dopant has an ionic radius close to a radius of an atom to be substituted. This leads to improvement in substitution efficiency and can prevent an unnecessary dopant not contributing to generation of carriers from deteriorating transistor characteristics.

An efficiency of generating carriers through doping depends on various process conditions at the time of the production of transistors, and therefore it is also important to select process conditions that can improve the carrier generation efficiency. For example, a desired carrier concentration can be achieved in a smaller doping amount by appropriately selecting: a temperature of a substrate when a n-type oxide semiconductor layer is formed by sputtering; a baking temperature when a n-type oxide semiconductor layer is formed by coating and baking a coating liquid; and a temperature of annealing performed after formation of the n-type oxide semiconductor layer.

A concentration of the dopant is not particularly limited and may be appropriately selected depending on the intended purpose. The concentration of the dopant is preferably from 0.01 mol % through 10 mol %, more preferably from 0.01 mol % through 5 mol %, particularly preferably from 0.05 mol % through 2 mol % in terms of mobility and rising property. Here, the mol % means a ratio of a molar amount of the dopant to a sum (100%) of a molar amount of a metal element to be substituted in the semiconductor (that is, a molar amount of the metal ion to be substituted with the dopant, which is included in the n-type oxide semiconductor) and a molar amount of the dopant.

The n-type oxide semiconductor forming an active layer is preferably in a state of monocrystalline or polycrystalline in order for substitutional doping to effectively work. Even in a case where diffraction peaks from the n-type oxide semiconductor are not observed by X-ray diffraction (XRD) and a long-distance order is not present (typically such a state is referred to as an amorphous state), the n-type oxide semiconductor preferably has a rigid structure where atoms are aligned orderly in a short distance. The above-described structure is preferable for the following reason. Specifically, in the case where an oxide semiconductor to be a mother phase is a highly amorphous material, the structure is changed to a locally stable state and carriers are not generated even after substitutional doping. In the case of the oxide having the rigid structure, oxygen-coordinating polyhedrons (e.g., $WO_6$ or $InO_6$ octahedrons) and their linking manners (e.g., $InO_6$ edge-sharing chains) are maintained, and substitutional doping effectively works. In this structure, a state density of tail states unique to the amorphous state is small and therefore sub-gap absorption is small. As a result, photodeterioration of the material having the above structure is excellent than highly amorphous materials.

Doping is similarly effective on the n-type oxide semiconductor even in a monocrystalline or polycrystalline state in which a long-distance order is present. In a case where conduction bands are formed with 4s, 5s, and 6s bands of heavy metal ions, an influence from grain boundaries is small, and excellent characteristics are obtained even in a polycrystalline state. In a case where a doping amount is excessive and the dopant is segregated at grain boundaries, it is preferable to lower the concentration of the dopant. It is also preferable to perform post annealing at a temperature of from 200 degrees Celsius through 300 degrees Celsius in order to improve adhesion and electrical contacts at an interface between the source and drain electrodes and the active layer. Moreover, annealing may be performed at a higher temperature to enhance crystallinity.

An average thickness of the active layer is not particularly limited and may be appropriately selected depending on the intended purpose, but the average thickness of the active layer is preferably from 5 nm through 1 micrometer, more preferably from 10 nm through 0.5 micrometers.

<Gate Insulating Layer>

The gate insulating layer is not particularly limited and may be appropriately selected depending on the intended purpose, so long as the gate insulating layer is a gate insulating layer disposed between the gate electrode and the active layer.

A material of the gate insulating layer is not particularly limited and may be appropriately selected depending on the intended purpose. Examples of the material of the gate insulating layer include inorganic insulating materials and organic insulating materials.

Examples of the inorganic insulating materials include silicon oxide, aluminum oxide, tantalum oxide, titanium oxide, yttrium oxide, lanthanum oxide, hafnium oxide, zirconium oxide, silicon nitride, aluminum nitride, and mixtures thereof.

Examples of the organic insulating materials include polyimide, polyamide, polyacrylate, polyvinyl alcohol, and novolac resins.

An average thickness of the gate insulating layer is not particularly limited and may be appropriately selected depending on the intended purpose, but the average thickness of the gate insulating layer is preferably from 50 nm through 3 micrometers, more preferably from 100 nm through 1 micrometer.

<Other Components>

Examples of the other components include a substrate, an insulating layer (passivation layer), and an interlayer insulating layer.

<<Substrate>>

A shape, a structure, and a size of the substrate are not particularly limited and may be appropriately selected depending on the intended purpose.

The substrate is not particularly limited and may be appropriately selected depending on the intended purpose. Examples of the substrate include a glass substrate, a ceramic substrate, a plastic substrate, and a film substrate.

A material of the glass substrate is not particularly limited and may be appropriately selected depending on the intended purpose. Examples of the material of the glass substrate include an alkali-free glass and a silica glass.

Materials of the plastic substrate and the film substrate are not particularly limited and may be appropriately selected depending on the intended purpose. Examples of the materials of the plastic substrate and the film substrate include polycarbonate (PC), polyimide (PI), polyethylene terephthalate (PET), and polyethylene naphthalate (PEN).

<<Insulating Layer (Passivation Layer)>>

A preferable embodiment is that the transistor also has a configuration where the insulating layer (passivation layer) is stacked on the field-effect transistor including the gate electrode, the source electrode, the drain electrode, the active layer, and the gate insulating layer. This insulating layer often serves as a so-called passivation layer configured to prevent the source electrode, the drain electrode, and the active layer from directly contacting with oxygen and moisture in the air and changing their characteristics. In addition, in the display device including the field-effect transistor, a display element including, for example, an emissive layer may be stacked on the top of the transistor. In this case, the insulating layer also serves as a so-called leveling film, which is configured to absorb level differences derived from a shape of the transistor, to flatten the surface.

A material of the insulating layer is not particularly limited and may be appropriately selected depending on the intended purpose. Examples of the material of the insulating layer include: materials that have already widely been used for mass production (e.g., $SiO_2$, SiON, and SiNx); and organic materials such as polyimide (PI) and fluorine-based resins.

<<Interlayer Insulating Layer>>

The configurations of the transistor are, for example, a configuration where wires for data lines are connected to the source electrode and the drain electrode and a configuration where data lines are disposed so that the source electrode and the drain electrode are directly coupled to the active layer. In the aforementioned configurations, it is preferable that the interlayer insulating layer be formed between the gate electrode and the data line.

A material of the interlayer insulating layer is not particularly limited and may be appropriately selected depending on the intended purpose. Examples of the material of the interlayer insulating layer include: materials that have already been widely used for mass production (e.g., $SiO_2$, SiON, and SiNx); and organic materials such as polyimide (PI) and fluorine-based resins. The gate insulating layer can have the same materials as used for the passivation layer.

A volume resistivity of the interlayer insulating layer is not particularly limited and may be appropriately selected depending on the intended purpose so long as the interlayer insulating layer is an insulating film. The volume resistivity of the interlayer insulating layer is preferably $1 \times 10^{10}$ $\Omega$cm or more, more preferably $1 \times 10^{12}$ $\Omega$cm or more, particularly preferably $1 \times 10^{13}$ $\Omega$cm or more. When the interlayer insulating layer has a smaller insulation property, malfunction such as leakage and short-circuit may arise.

A formation method of the interlayer insulating layer is not particularly limited and may be appropriately selected depending on the intended purpose. Examples of the formation method include: (i) a step of forming a film through sputtering, spin-coating, or slit-coating and patterning the film through photolithography; and (ii) a method of directly forming a film having a desired shape through a printing process such as inkjet printing, nanoimprinting, nozzle printing, or gravure printing.

A method for producing the field-effect transistor is not particularly limited and may be appropriately selected depending on the intended purpose, but is preferably a method for producing the field-effect transistor of the present disclosure, which will be described hereinafter.

Hereinafter, a schematic cross-sectional view illustrating one example of the field-effect transistor of the present disclosure will be illustrated.

FIG. 1 is a schematic cross-sectional view illustrating one example of a field-effect transistor of the present disclosure.

A field-effect transistor illustrated in FIG. 1 includes a substrate 11, a source electrode 12, a drain electrode 13, an active layer 14, a gate insulating layer 15, and a gate electrode 16.

The field-effect transistor illustrated in FIG. 1 is a top gate/bottom contact field-effect transistor field-effect transistor.

The source electrode 12 is formed of a metal region 12A and an oxide region 12B.

The drain electrode 13 is formed of a metal region 13A and an oxide region 13B.

In the field-effect transistor illustrated in FIG. 1, the source electrode 12 and the drain electrode 13 are disposed on the insulative substrate 11 so as to provide a predetermined interval. The active layer 14 is disposed so as to be in contact with a part of the oxide region 12B constituting the source electrode 12 and a part of the oxide region 13B constituting the drain electrode 13 to form a channel on the active layer 14. Furthermore, the gate insulating layer 15 is disposed so as to cover the source electrode 12, the drain electrode 13, and the active layer 14. The gate electrode 16 is disposed on the gate insulating layer 15. The oxide region 12B constituting the source electrode 12 is also in contact with the substrate 11 and the gate insulating layer 15. The oxide region 13B constituting the drain electrode 13 is also in contact with the substrate 11 and the gate insulating layer 15.

FIG. 2 is a schematic cross-sectional view illustrating another example of the field-effect transistor.

A field-effect transistor illustrated in FIG. 2 is a bottom gate/bottom contact field-effect transistor.

The field-effect transistor illustrated in FIG. 2 includes: a substrate 11; a gate electrode 16 disposed on the substrate 11; a gate insulating layer 15 disposed on the gate electrode 16; a source electrode 12 and a drain electrode 13 disposed on the gate insulating layer 15; and an active layer 14 disposed between the source electrode 12 and the drain electrode 13.

The source electrode 12 is formed of a metal region 12A and an oxide region 12B.

The drain electrode 13 includes a metal region 13A and an oxide region 13B.

The active layer 14 is in contact with a part of the oxide region 12B constituting the source electrode 12 and a part of the oxide region 13B constituting the drain electrode 13.

The oxide region 12B constituting the source electrode 12 is also in contact with the gate insulating layer 15. The oxide region 13B constituting the drain electrode 13 is also in contact with the gate insulating layer 15.

(Method for Producing Field-Effect Transistor)

A method for producing the field-effect transistor of the present disclosure includes at least a step of forming the source electrode, the drain electrode, and the active layer, and further includes other steps such as a step of forming the gate electrode and a step of forming the gate insulating layer if necessary.

The method for producing the field-effect transistor is a method for producing a field-effect transistor, where the field-effect transistor includes a gate electrode, which is configured to apply gate voltage; a source electrode and a drain electrode, which are configured to take electric current out; an active layer, which is disposed between the source electrode and the drain electrode and is formed of an oxide semiconductor; and a gate insulating layer, which is disposed between the gate electrode and the active layer, the source electrode and the drain electrode each including a metal region formed of a metal and an oxide region formed of one or more metal oxides, and a part of the oxide region in each of the source electrode and the drain electrode being in contact with the active layer.

The aforementioned method for producing the field-effect transistor is a preferable method for producing the field-effect transistor of the present disclosure.

<Step of Forming Source Electrode, Drain Electrode, and Active Layer>

<<First Aspect>>

One aspect (first aspect) of the step of forming the source electrode, the drain electrode, and the active layer includes a treatment of oxidizing a surface of a metal layer to form the source electrode and the drain electrode each having the metal region and the oxide region; and a treatment of forming the active layer so as to be in contact with the part of the oxide region in each of the source electrode formed and the drain electrode formed.

The aforementioned treatment of forming the source electrode and the drain electrode in the first aspect is not particularly limited and may be appropriately selected depending on the intended purpose, so long as the treatment is a step of oxidizing a surface of a metal layer to form the source electrode and the drain electrode. Examples of the treatment include a heat treatment of heating the metal layer and a plasma treatment of irradiating the metal layer with plasma.

<<Second Aspect>>

Another one aspect (second aspect) of the step of forming the source electrode, the drain electrode, and the active layer includes a treatment of forming the active layer; and a treatment of forming the oxide region so that the part of the oxide region is in contact with the active layer formed and further forming the metal region on the oxide region to form the source electrode and the drain electrode each including the oxide region and the metal region.

Examples of the treatment of forming the source electrode and the drain electrode in the second aspect include a treatment of stacking a metal layer and a conductive oxide layer.

<<Third Aspect>>

Another one aspect (third aspect) of the step of forming the source electrode, the drain electrode, and the active layer includes: a treatment of forming the active layer; a treatment of oxidizing a surface of the metal layer to form the source electrode and the drain electrode each including the metal region and the oxide region so that the part of the oxide region is in contact with the active layer formed.

The first aspect, the second aspect, and the third aspect can be selected depending on the structure of the field-effect transistor.

A bottom contact field-effect transistor has a structure where an upper surface (outermost surface) of the source electrode and an upper surface (outermost surface) of the drain electrode are in contact with the active layer. Therefore, any treatment is desirably performed before formation of the active layer.

Meanwhile, a top contact field-effect transistor has a structure where a bottom surface (undermost surface) of the source electrode and a bottom surface (undermost surface) of the drain electrode are in contact with the active layer. Therefore, after formation of the active layer and the metal layer to be formed into the source electrode and the drain electrode, the heat treatment is performed to form the oxide region at an interface between the active layer and the metal layer. In this case, oxygen for forming the oxide region formed at the interface is mainly supplied from the oxide semiconductor that forms the active layer. Therefore, oxygen concentration in the oxide semiconductor is designed to be excessive and the oxygen region is formed at the interface through the heat treatment, resulting in formation of the stable oxide semiconductor as the active layer. This makes it possible to obtain suitable carrier concentration even if the oxide semiconductor is deprived of oxygen into the metal layer. In this case, the oxide semiconductor to be the active layer is more preferably an oxide semiconductor undergoing a substitutional doping in terms of a control of the carrier concentration of the active layer, as described above.

In the treatment of stacking the metal layer and the conductive oxide layer, a film of the conductive oxide layer is formed after formation of the active layer, followed by formation of a film of the metal layer. The formation of the conductive oxide layer can be appropriately selected depending on the intended purpose. Examples of the formation of the conductive oxide layer include vacuum processes of the film formation such as a sputtering method.

In a reactive sputtering method using a metal target, a film can be formed by controlling a flow rate of oxygen upon the film formation to control a concentration of the oxygen in the oxide region. In the reactive sputtering method, the same target can be used to produce a thin film having stoichiometry over a wide range of the thin film. In most cases, reactive sputtering methods using a metal target, when a reactive gas such as oxygen flows at a certain flow rate or higher to discharge electricity with a constant sputtering power, there is a region at which cathode voltage drastically changes. In order to stably form a film within this region, a feedback system configured to monitor intensity of plasma emission and the cathode voltage to control the flow rate of the reactive gas in real time is preferably used.

In addition, the metal constituting the conductive oxide layer and the metal constituting the metal layer are the same of a metal.

Alternatively, in order to form the conductive oxide layer, an oxide target including the same metal element as that of the metal layer may be used. In that case, the oxide target for forming the conductive oxide layer and the metal target for forming the metal layer may separately be used.

In addition to the active layer, another component other than the active layer is formed of oxides, when oxygen is supplied to form the oxide regions to be a part of the source electrode and a part of the drain electrode, the active layer and another component other than the active layer, which are the underlying component, are supplied with sufficient oxygen. Therefore, upon forming the metal region, it is possible to lessen influences given to the underlying component.

A heating temperature of the heating treatment is not particularly limited and may be appropriately selected depending on the intended purpose so long as the surface of the metal layer can be oxidized. The heating temperature of the heating treatment is preferably from 50 degrees Celsius through 400 degrees Celsius, more preferably through 100 degrees Celsius from 300 degrees Celsius.

The heating treatment is performed in the air atmosphere so that the surface of the metal layer or an interface of the active layer and the metal layer can be oxidized.

The plasma treatment is performed in the oxidizing atmosphere, for example. Examples of the oxidizing atmosphere include atmospheres including, for example, oxygen, ozone, and carbon dioxide.

<<Treatment of Forming Active Layer>>

A treatment of forming the active layer is not particularly limited and may be appropriately selected depending on the intended purpose. Examples of the treatment of forming the active layer include: physical vapor deposition methods (Physical Vapor Deposition methods) such as sputtering and PLD (laser ablation); chemical vapor deposition methods such as plasma CVD; solution coating methods such as a sol-gel method; and known film forming methods. A method for patterning the active layer is, for example, a step of the patterning using a shadow mask, a step of the patterning through photolithography, and a step of directly forming a film having a desired shape through printing or inkjet.

<Step of Forming Gate Electrode>

The step of forming the gate electrode is not particularly limited and may be appropriately selected depending on the intended purpose so long as it is a step of forming the gate electrode. Examples of the step of forming the gate electrode include: (i) a step of forming a film through a sputtering method or a dip coating method to pattern the film through photolithography; and (ii) a method of directly forming a film having a desired shape through a printing process such as inkjet printing, nanoimprinting, or gravure printing.

<Step of Forming Gate Insulating Layer>

A step of forming the gate insulating layer is not particularly limited and may be appropriately selected depending on the intended purpose so long as it is a step of forming the gate insulating layer. Examples of the step of forming the gate insulating layer include: (i) a step of forming a film through a sputtering method or a dip coating method to pattern the film through photolithography; and (ii) a method of directly forming a film having a desired shape through a printing process such as inkjet printing, nanoimprinting, or gravure printing.

Here, one example of the method for producing the field-effect transistor of the present disclosure will be described with reference to FIG. 3A to FIG. 3E.

First, a substrate 11 formed of a glass substrate is disposed. Then, a metal film is formed on the substrate 11 through, for example, a sputtering method. The formed metal film is patterned through photolithography and etching to form a metal layer 2 and a metal layer 3 having a desired shape (FIG. 3A). In order to clean a surface of the substrate 11 and improve the surface in close adhesiveness, a pretreatment such as oxygen plasma, UV ozone, and UV irradiation cleaning is preferably performed before formation of the metal film.

Next, the metal layer 2 and the metal layer 3 are subjected to an oxidation treatment. Examples of the oxidation treatment include a heat treatment step using an oven in the air and a plasma treatment under the oxidizing atmosphere. In the oxidization treatment, the metal layers 2 and 3, which are not in contact with the substrate 11, are oxidized. Through the oxidization treatment, the metal layer 2 is formed into the source electrode 12 including the metal region 12A and the oxide region 12B and the metal layer 3 is formed into the drain electrode 13 including the metal region 13A and the oxide region 13B (FIG. 3B).

Here, in FIG. 3B, an interface between the metal region 12A and the oxide region 12B and an interface between the metal region 13A and the oxide region 13B are clearly defined. However, in a field-effect transistor of the present disclosure and a field-effect transistor obtained by a method for producing the field-effect transistor of the present disclosure, these interfaces are not necessarily clearly defined so long as it can be confirmed that the metal region and the oxide region each exist in the source electrode and the drain electrode.

Next, a film of the oxide semiconductor is formed. The formed film of the oxide semiconductor is patterned through photolithography and wet-etching to obtain an active layer 14 having a predetermined shape (FIG. 3C).

Then, on the substrate 11, a gate insulating layer 15 is formed through a sputtering method to cover the source electrode 12, the drain electrode 13, and the active layer 14 (FIG. 3D).

Then, a metal film formed of, for example, aluminum (Al) is formed on the gate insulating layer 15 through, for example, a sputtering method. The formed metal film is patterned through photolithography and etching to form a gate electrode 16 having a predetermined shape (FIG. 3E).

Through the above steps, a top gate/bottom contact field-effect transistor can be produced.

Another one example of a field-effect transistor of the present disclosure will be described with reference to one example of a method for producing the field-effect transistor.

<<Bottom Gate/Top Contact Field-Effect Transistor>>

A field-effect transistor illustrated in FIG. 4 is a bottom gate/top contact field-effect transistor.

One example of a method for producing the field-effect transistor will be described hereinafter.

First, a gate electrode 16 is formed on a substrate 11.

Next, a gate insulating layer 15 is formed on the substrate 11 and the gate electrode 16.

Then, an active layer 14 is formed on the gate insulating layer 15.

Then, a source electrode 12 and a drain electrode 13 are formed on the gate insulating layer 15 and the active layer 14. The source electrode 12 is formed of a metal region 12A and an oxide region 12B. The drain electrode 13 is formed of a metal region 13A and an oxide region 13B.

The source electrode 12 and the drain electrode 13 are formed through, for example, the following method. An oxide film is formed on the gate insulating layer 15 and the active layer 14 and then a metal film is formed on the oxide film, which is subjected to etching at one time. As a result, the oxide film and the metal film are divided to form oxide regions 12B and 13B and metal regions 12A and 13A at one time. Then, the source electrode 12 and the drain electrode 13 are formed.

Formation of the oxide film can be performed through, for example, a sputtering method. In a reactive sputtering method using a metal target, a film can be formed by controlling a flow rate of oxygen upon forming the film and by controlling a concentration of the oxygen in the oxide region. In addition, the metal constituting the oxide film and the metal constituting the metal film are the same of a metal.

As described above, a bottom gate/top contact field-effect transistor illustrated in FIG. 4 can be obtained.

<<Top Gate/Top Contact Field-Effect Transistor>>

Field-effect transistors illustrated in FIG. 5 and FIG. 7 are top gate/top contact field-effect transistors.

One example of a method for forming these field-effect transistors will be described hereinafter.

First, an active layer 14 is formed on a substrate 11.

Next, a source electrode 12 and a drain electrode 13 are formed on the substrate 11 and the active layer 14. The source electrode 12 is formed of a metal region 12A and an oxide region 12B. The drain electrode 13 is formed of a metal region 13A and an oxide region 13B.

The source electrode 12 and the drain electrode 13 are formed through, for example, the following method. An oxide film is formed on the substrate 11 and the active layer 14 and then a metal film is formed on the oxide film, which is subjected to etching at one time. As a result, the oxide film and the metal film are divided to form oxide regions 12B and 13B and metal regions 12A and 13A at one time. Then, the source electrode 12 and the drain electrode 13 are formed.

Formation of the oxide film can be performed through, for example, a sputtering method. In a reactive sputtering method using a metal target, a film can be formed by controlling a flow rate of oxygen upon forming the film and by controlling a concentration of the oxygen in the oxide region. In addition, the metal constituting the oxide film and the metal constituting the metal film are the same of a metal.

Next, a gate insulating layer 15 is formed on the source electrode 12, the drain electrode 13, and the active layer 14.

Then, a gate electrode 16 is formed on the gate insulating layer 15.

As described above, the top gate/top contact field-effect transistor illustrated in FIG. 5 can be obtained.

Furthermore, an interlayer insulating layer 17 is formed on the gate insulating layer 15 and the gate electrode 16.

Next, through holes are formed so as to reach the source electrode 12 and the drain electrode 13 in the gate insulating layer 15 and the interlayer insulating layer 17. Then, data lines 18 are formed.

As described above, the top gate/top contact field-effect transistor illustrated in FIG. 7 can be obtained.

<<Top Gate/Top Contact Field-Effect Transistor>>

A field-effect transistor illustrated in FIG. 6 is a top gate/top contact field-effect transistor.

One example of a method for producing the field-effect transistor will be described hereinafter.

First, an active layer 14 is formed on a substrate 11.

Next, a source electrode 12 and a drain electrode 13 are formed on the substrate 11 and the active layer 14. The source electrode 12 is formed of a metal region 12A and an oxide region 12B. The drain electrode 13 is formed of a metal region 13A and an oxide region 13B.

The source electrode 12 and the drain electrode 13 are formed through, for example, the following method. A metal film is formed on the substrate 11 and the active layer 14, which is subjected to a heat treatment. As a result, oxide regions 12B and 13B are formed at an interface between the active layer 14 and the metal film and on the surface of the metal film. That is, the oxide regions 12B and 13B are formed around the metal regions 12A and 13A to form the source electrode 12 and the drain electrode 13 as illustrated in FIG. 6.

The formation of the metal film can be performed via a metal mask through a sputtering method.

Then, a gate insulating layer 15 is formed on the source electrode 12, the drain electrode 13, and the active layer 14.

Then, a gate electrode 16 is formed on the gate insulating layer 15.

As described above, a top gate/top contact field-effect transistor illustrated in FIG. 6 can be obtained.

A field-effect transistor illustrated in FIG. 8 is a top gate/top contact field-effect transistor.

One example of a method for producing the field-effect transistor will be described hereinafter.

First, an active layer 14 is formed on a substrate 11.

Next, a gate insulating layer 15 is formed on the substrate 11 and the active layer 14.

Then, a gate electrode 16 is formed on the gate insulating layer 15.

Then, an interlayer insulating layer 17 is formed on the gate insulating layer 15 and the gate electrode 16.

Then, an area to be the source electrode 12 and an area to be the drain electrode 13, each of which passes in the gate insulating layer 15 and the interlayer insulating layer 17, are subjected to etching until the active layer 14 is exposed.

Then, a gate electrode 12 and a drain electrode 13 are formed on the exposed active layer 14.

The source electrode 12 and the drain electrode 13 are formed through, for example, the following method. An oxide film is formed on the surfaces of the interlayer insulating layer 17, the gate insulating layer 15, and the active layer 14. Then, a metal film is formed on the oxide film, which is subjected to etching at one time. As a result, the oxide film and the metal film are divided to form oxide regions 12B and 13B and metal regions 12A and 13A at one time. Then, the source electrode 12 and the drain electrode 13 are formed.

Formation of the oxide film can be performed through, for example, a sputtering method. In a reactive sputtering method using a metal target, a film can be formed by controlling a flow rate of oxygen upon forming the film and by controlling a concentration of the oxygen in the oxide region. In addition, the metal constituting the oxide film and the metal constituting the metal film are the same of a metal.

As described above, a top gate/top contact field-effect transistor illustrated in FIG. 8 can be obtained.

As a modification example of FIG. 6, a bottom gate/top contact field-effect transistor is illustrated in FIG. 9.

As a modification example of FIG. 7, a bottom gate/top contact field-effect transistor is illustrated in FIG. 10.

As a modification example of FIG. 8, a bottom gate/top contact field-effect transistor is illustrated in FIG. 11.

As one example of a method for producing these field-effect transistors, only different points from the method for producing the top gate/top contact field-effect transistor will be extracted and described below.

First, a gate electrode 16 is formed on a substrate 11.

Next, a gate insulating layer 15 is formed on the substrate 11 and the gate electrode 16.

Then, an active layer 14 is formed on the gate insulating layer 15.

Hereinafter, the interlayer insulating layer 17, the source electrode 12, and the drain electrode 13 are formed in the same manner as in each method for forming the field-effect transistor of FIGS. 6 to 8.

As described above, the bottom gate/top contact field-effect transistors of FIGS. 9 to 11, which are modification examples of FIGS. 6 to 8, can be obtained.

(Display Element)

A display element of the present disclosure includes at least an optical control element and a driving circuit configured to drive the optical control element. The display element further includes other components according to the necessity.

<Optical Control Element>

The optical control element is not particularly limited and may be appropriately selected depending on the intended purpose, so long as the optical control element is an element configured to control a light output according to a driving signal. The optical control element preferably includes an organic electroluminescent (EL) element, an electrochromic (EC) element, a liquid crystal element, an electrophoretic element, or an electrowetting element.

<Driving Circuit>

The driving circuit is not particularly limited and may be appropriately selected depending on the intended purpose, so long as the driving circuit includes the semiconductor element of the present disclosure.

<Other Components>

The other components are not particularly limited and may be appropriately selected depending on the intended purpose.

The display element of the present disclosure includes the semiconductor element (for example, the field-effect transistor). Therefore, unevenness between elements is small. Moreover, even when the display element changes over time, the driving transistor can be driven at constant gate voltage, resulting in long lifetime of the elements.

(Image Display Device)

An image display device of the present disclosure includes at least a plurality of display elements, a plurality of wires, and a display control device. The image display device further includes other components according to the necessity.

<Display Element>

The display element is not particularly limited and may be appropriately selected depending on the intended purpose, so long as the display element is the display element of the present disclosure arranged in a form of matrix.

<Wired Line>

The wired line is not particularly limited and may be appropriately selected depending on the intended purpose, so long as the wired line is a wired line configured to individually apply gate voltage and image data signal to the field-effect transistor in the display element.

<Display Control Device>

The display control device is not particularly limited and may be appropriately selected depending on the intended purpose, so long as the display control device is a device configured to individually control the gate voltage and the signal voltage of the field-effect transistors via a plurality of the wires correspondingly to the image data.

<Other Components>

The other components are not particularly limited and may be appropriately selected depending on the intended purpose.

An image display device of the present disclosure includes the display element of the present disclosure. Therefore, the image display device has long lifetime and is stably driven.

The image display device of the present disclosure can be used as a display unit in mobile information devices (e.g., mobile phones, portable music players, portable video players, electronic books, and personal digital assistants (PDAs)) and camera devices (e.g., still cameras and video cameras). The image display device can also be used for display units of various pieces of information in transportation systems (e.g., cars, aircraft, trains, and ships). Furthermore, the image display device can be used for display units of various pieces of information in measuring devices, analysis devices, medical equipment, and advertising media.

(System)

A system of the present disclosure includes at least the image display device of the present disclosure and an image-data-generating device.

The image-data-generating device is configured to generate image data based on image information to be displayed and to output the image data to the image display device.

Because the system of the present disclosure includes the image display device of the present disclosure, image information with high definition can be displayed.

The image display device of the present disclosure will next be described hereinafter.

The image display device of the present disclosure can be obtained by employing configurations described in paragraphs 0059 to 0060 and FIGS. 2 and 3 of Japanese Unexamined Patent Application Publication No. 2010-074148.

One example of the embodiment of the present disclosure will next be described with reference to the figures.

FIG. 12 is a diagram for presenting a display in which display elements are arranged in a form of matrix. As illustrated in FIG. 12, the display includes "n" scanning lines (X0, X1, X2, X3, ... Xn−2, Xn−1) arranged along the X axis direction at constant intervals, "m" data lines (Y0, Y1, Y2, Y3, ... Ym−1) arranged along the Y axis direction at constant intervals, and "m" current supply lines (Y0i, Y1i, Y2i, Y3i, ... Ym−1i) arranged along the Y axis direction at constant intervals. Here, meanings of reference numerals (for example, X1 and Y1) are in common throughout FIGS. 13, 17, 18, and 19.

Therefore, the display element 302 can be identified by the scanning lines and the data lines.

FIG. 13 is a schematic structural view illustrating one example of the display element of the present disclosure.

As illustrated as one example in FIG. 13, the display element includes an organic electroluminescent (EL) element 350 and a drive circuit 320 configured to allow the organic EL element 350 to emit light. That is, a display 310 is an organic EL display of a so-called active matrix system. Moreover, the display 310 is a 32-inch display adaptable to colors. A size of the display 310 is not limited to 32 inches.

The drive circuit 320 in FIG. 13 will be described.

The drive circuit 320 includes two field-effect transistors 10 and 20 and a capacitor 30.

A field-effect transistor 10 serves as a switching element. A gate electrode G of the field-effect transistor 10 is coupled to a predetermined scanning line and a source electrode S of the field-effect transistor 10 is coupled to a predetermined data line. Moreover, a drain electrode D of the field-effect transistor 10 is coupled to one terminal of the capacitor 30.

The field-effect transistor 20 is configured to supply electric current to the organic EL element 350. The gate electrode G of the field-effect transistor 20 is coupled to the drain electrode D of the field-effect transistor 10. The drain electrode D of the field-effect transistor 20 is coupled to the anode of the organic EL element 350 and a source electrode S of the field-effect transistor 20 is coupled to a predetermined current supply line.

The capacitor 30 is configured to memorize the state of the field-effect transistor 10; i.e., data. The other terminal of the capacitor 30 is coupled to a predetermined current supply line.

When the field-effect transistor 10 turns into the state of "on", image data are stored in the capacitor 30 via the signal line Y2. Even after turning the field-effect transistor 10 into the state of "off", the organic EL element 350 is driven by maintaining the "on" state of the field-effect transistor 20 corresponding to the image data.

FIG. 14 presents one example of a positional relationship between an organic EL element 350 and a field-effect transistor 20 serving as a drive circuit in a display element. Here, the organic EL element 350 is disposed next to the field-effect transistor 20. Note that, a field-effect transistor and a capacitor (not illustrated) are also formed on the same substrate.

A passivation film is suitably disposed on or above the active layer 22, although the passivation film is not illustrated in FIG. 14. A material of the passivation film may be appropriately selected from $SiO_2$, SiNx, $Al_2O_3$, and fluoropolymers.

As illustrated in FIG. 15, for example, the organic EL element 350 may be disposed on the field-effect transistor 20. In the case of this structure, the gate electrode 26 is required to have transparency. Therefore, a conductive transparent oxide (e.g., ITO, $In_2O_3$, $SnO_2$, ZnO, Ga-added ZnO, Al-added ZnO, and Sb-added $SnO_2$) is used for the gate electrode 26. Note that, reference numeral 360 is an interlayer insulating film (a leveling film). Polyimide or acrylic resins can be used for the insulating film.

In FIGS. 14 and 15, the field-effect transistor 20 includes a substrate 21, an active layer 22, a source electrode 23, a drain electrode 24, a gate insulating layer 25, and a gate electrode 26. An organic EL element 350 includes a cathode 312, an anode 314, and an organic EL thin film layer 340.

FIG. 16 is a schematic structural view illustrating one example of an organic EL element.

In FIG. 16, an organic EL element 350 includes a cathode 312, an anode 314, and an organic EL thin film layer 340.

A material of the cathode 312 is not particularly limited and may be appropriately selected depending on the intended purpose. Examples of the material include aluminium (Al), magnesium (Mg)-silver (Ag) alloy, aluminium (Al)-lithium (Li) alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In the figure, light is taken out from the side of the anode. However, light can be taken out from the side of the cathode when the cathode is a transparent electrode or a semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in a case where a silver alloy is used, the resultant electrode becomes a high-reflective electrode, which is suitable for taking light out from the side of the cathode.

The organic EL thin film layer 340 includes an electron transporting layer 342, a light emitting layer 344, and a hole transporting layer 346. The electron transporting layer 342 is coupled to a cathode 312 and the hole transporting layer 346 is coupled to an anode 314. The light emitting layer 344 emits light when a predetermined voltage is applied between the anode 314 and the cathode 312.

The electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described organic EL element is a so-called "bottom emission" organic EL element, in which light is taken out from the side of the substrate (the bottom side in FIG. 16). However, the organic EL element may be a "top emission" organic EL element, in which light is taken out from the opposite side to the substrate (the bottom side in FIG. 16).

FIG. 17 is a schematic structural view illustrating another example of the image display device of the present disclosure.

In FIG. 17, the image display device includes display elements 302, wires (including scanning lines, data lines, and current supply lines), and a display control device 400.

The display control device 400 includes an image-data-processing circuit 402, a scanning-line-driving circuit 404, and a data-line-driving circuit 406.

The image-data-processing circuit 402 determines brightness of a plurality of display elements 302 in the display based on output signals of an image output circuit.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

In the above embodiment, a case where the optical control element is an organic EL element has been described, but the present disclosure is not limited to the above. For example, the optical control element may be an electrochromic element. In this case, the display is an electrochromic display.

The optical control element may be a liquid crystal element. In this case, the display is a liquid crystal display. As illustrated in FIG. 18, it is not necessary to provide a current supply line for a display element 302'. As illustrated in FIG. 19, the drive circuit 320' may be produced with one field-effect transistor 40, which is similar to each of the field-effect transistors 10 and 20. In the field-effect transistor 40, a gate electrode G is coupled to a predetermined scanning line and a source electrode S is coupled to a predetermined data line. Moreover, a drain electrode D is coupled to a capacitor 361 and a pixel electrode of a liquid crystal element 370.

The optical control element may be an electrophoretic element, an inorganic EL element, or an electrowetting element.

As described above, a case where the system of the present disclosure is a television device has been described, but the system of the present disclosure is not limited to the television device. The system is not particularly limited, so long as the system includes the image display device serving as a device configured to display images and information. For example, the system may be a computer system in which a computer (including a personal computer) is coupled to the image display device.

A system of the present disclosure includes the display element of the present disclosure. Therefore, the system has long lifetime and is stably driven.

EXAMPLES

The present disclosure will next be described by way of Examples, but the present disclosure should not be construed as being limited to these Examples.

Example 1

<Production of Field-Effect Transistor>

In Example 1, a top gate/bottom contact field-effect transistor as presented in FIG. 1 was produced. Here, numerical references presented in the following Examples correspond to the numerical references in FIG. 1 and FIGS. 3A to 3E.

<<Formation of Source Electrode and Drain Electrode>>

Formation of Source Electrode Precursor and Drain Electrode Precursor

An Al film to be the second layer was formed on a substrate 11 through a sputtering method so as to have a thickness of 100 nm. Then, a Mo film to be the first layer was formed on the Al film so as to have a thickness of 30 nm.

Next, resist patterns were formed through photolithography on the formed Al/Mo film and the resultant was subjected to etching to form, on the substrate 11, a metal layer 2 and a metal layer 3 each of which has a predetermined shape.

—Oxidation Treatment—

The formed metal layer 2 and the formed metal layer 3 were subjected to heat treatment at 200 degrees Celsius with an oven under the atmosphere to form oxide regions 12B and 13B.

<<Formation of Active Layer>>

Next, a film of $MgIn_2O_4$ was formed so as to have a film thickness of 50 nm through an RF magnetron sputtering method on a region disposed across the source electrode and the drain electrode on the substrate. As described above, the surfaces of the source electrode and the drain electrode include oxygen, and the active layer is stacked thereon. Therefore, the oxygen-including regions of the electrodes are in contact with the active layer. When the active layer was formed through sputtering, a poly-crystalline sintered body having a constitution of $MgIn_2O_4$ was used as a target. An argon gas and an oxygen gas were introduced as sputtering gasses. A total pressure was fixed to 1.1 Pa and oxygen concentration was set to 2.5% by volume. On the formed $MgIn_2O_4$ film, resist patterns were formed through photolithography and the resultant was subjected to etching to form an active layer 14 having a predetermined shape.

<<Formation of Gate Insulating Layer>>

Next, through a sputtering method, a film of $SiO_2$ was formed so as to have a thickness of 200 nm to form a gate insulating layer 15.

<<Formation of Gate Electrode>>

Finally, an Al film was formed on the gate insulating layer 15 through a sputtering method so as to have a thickness of 100 nm. On the formed Al film, resist patterns were formed through photolithography and the resultant was subjected to etching to form a gate electrode 16 having a predetermined shape. Subsequently, using an oven, the film was subjected to an annealing treatment for 1 hour at 300 degrees Celsius in the air. This annealing treatment is generally performed in order to improve transistor characteristics by decreasing interface defect density between the active layer and the gate insulating layer.

As described above, a top gate/bottom contact field-effect transistor presented in FIG. 1 was completed.

(Production of Element for Measuring Work Function)

In order to measure work function, an element for measuring work function was obtained in the same manner as in the <<Formation of source electrode and drain electrode>> except that a metal layer, on which a surface of the metal layer was oxidized, was formed on a glass substrate.

(Evaluation of Work Function)

In the obtained element for measuring work function, a photoelectron spectroscopy AC-2 (available from Riken Keiki Co., Ltd.) was used to measure the surface-oxidized metal layer for work function in the air. The obtained work function was presented in Table 1. In Table 1, configurations of the source electrode and the drain electrode are presented. However, when the source electrode and the drain electrode have a single layer, the electrodes are presented as the "first layer" for the sake of convenience.

(Electric Characteristics)

The field-effect transistor obtained in Example 1 was evaluated for transistor performances using a semiconductor parameter-analyzer device (available from Agilent Technologies, semiconductor parameter analyzer B1500). Specifically, the source/drain electric current (Ids) and the gate electric current |Ig| were measured by changing gate voltage (Vg) from −15 V to +15 V with the source/drain voltage (Vds) being 10 V to evaluate electric current-voltage characteristics.

As a result of evaluation of the transistor performances, favorable transistor characteristics were obtained. A ratio (on/off ratio) of the source/drain electric current (Ids) of the on-state (for example, Vg=15 V) to the source/drain electric current (Ids) of the off-state (for example, Vg=−15 V) of the transistor was calculated and was presented in Table 1.

Example 2

<Production of Field-Effect Transistor>

In Example 2, a top gate/bottom contact field-effect transistor was produced in the same manner as in Example 1 except that the —Formation of source electrode precursor and drain electrode precursor—, the oxidation treatment in the "formation of source electrode and drain electrode", and the <<Formation of active layer>> were changed to the below-described methods.

The same evaluations as described in Example 1 were performed. Results are presented in Table 1.

<<Formation of Source Electrode and Drain Electrode>>

—Formation of Source Electrode Precursor and Drain Electrode Precursor—

A metal layer 2 and a metal layer 3 were formed in the same manner as in the production steps of the field-effect transistor in Example 1 except that the target used for forming the first layer was changed to each target presented in Table 1.

—Oxidation Treatment—

The formed metal layer 2 and metal layer 3 were subjected to plasma treatment in an oxidizing atmosphere under the following conditions to form oxide regions 12B and 13B.

The plasma treatment under the oxidizing atmosphere was performed under the following conditions: ultimate vacuum within the chamber: 10 Pa or less; oxygen flow rate: 50 sccm; and supplied power: 500 W.

<<Formation of Active Layer>>

An active layer was formed in the same manner as in Example 1 except that the target of the Example 1 was changed to each target presented in Table 1.

Example 3

<Production of Field-Effect Transistor>

In Example 3, a top gate/bottom contact field-effect transistor was produced in the same manner as in Example 1 except that the —Formation of source electrode precursor and drain electrode precursor— and the "formation of active layer" in Example 1 were changed.

The same evaluations as described in Example 1 were performed. Results are presented in Table 1.

—Formation of Source Electrode Precursor and Drain Electrode Precursor—

A metal layer 2 and a metal layer 3 were formed in the same manner as in the production steps of the field-effect transistor in Example 1 except that the target used for forming the first layer was changed to each target presented in Table 1.

<<Formation of Active Layer>>

Next, on a region disposed across the source electrode and the drain electrode on the substrate, a film of W-doped $MgIn_2O_4$ was formed through a RF magnetron sputtering method so as to have a film thickness of 50 nm. As described above, the surfaces of the source electrode and the drain electrode include oxygen, and the active layer is stacked thereon. Therefore, the oxygen-including regions of the electrodes are configured to be in contact with the active layer. When the active layer was formed through sputtering, a polycrystalline sintered body having a constitution of $MgIn_{1.99}W_{0.01}O_4$ was used as a target. An argon gas and an oxygen gas were introduced as sputtering gasses. A total pressure was fixed to 1.1 Pa and oxygen concentration was set to 10% by volume. On the formed W-doped $MgIn_2O_4$, resist patterns were formed through photolithography and the resultant was subjected to etching to form an active layer 14 having a predetermined shape. In the thus-obtained active layer, In in $MgIn_2O_4$ underwent substitutional doping with W in a concentration of 0.5 mol %.

Example 4

<Production of Field-Effect Transistor>

In Example 4, a top gate/bottom contact field-effect transistor was produced in the same manner as in Example 3 except that the —Formation of source electrode precursor and drain electrode precursor— in Example 3 was changed to the below-described method.

The same evaluations as described in Example 1 were performed. Results are presented in Table 1.

—Formation of Source Electrode Precursor and Drain Electrode Precursor—

A metal layer 2 and a metal layer 3 were formed in the same manner as in the production steps of the field-effect transistor in Example 3 except that the target used for forming the first layer was changed to each target presented in Table 1.

Example 5

<Production of Field-Effect Transistor>

In Example 5, a top gate/bottom contact field-effect transistor was produced in the same manner as in Example 2 except that the —Formation of source electrode precursor and drain electrode precursor— and the "formation of active layer" in Example 2 were changed to the below-described methods.

The same evaluations as described in Example 1 were performed. Results are presented in Table 1.

—Formation of Source Electrode Precursor and Drain Electrode Precursor—

A metal layer 2 and a metal layer 3 were formed in the same manner as in the production steps of the field-effect transistor in Example 1 except that the target used for forming the first layer was changed to each target presented in Table 1.

<<Formation of Active Layer>>

A film of an active layer was formed in the same manner as in the production steps of the field-effect transistor in Example 2 except that the sintered body target for forming the active layer and the concentration of oxygen (i.e., sputtering gas) were changed as described in Table 1.

Example 6

<Production of Field-Effect Transistor>

In Example 6, a top gate/bottom contact field-effect transistor was produced in the same manner as in Example 5 except that the -Formation of source electrode precursor and drain electrode precursor- in Example 5 was changed to the below-described method.

The same evaluations as described in Example 1 were performed. Results are presented in Table 1.

—Formation of Source Electrode Precursor and Drain Electrode Precursor—

A metal layer 2 and a metal layer 3 were formed in the same manner as in the production steps of the field-effect transistor in Example 1 except that the target used for forming the first layer was changed to each target presented in Table 1.

Example 7

<Production of Field-Effect Transistor>

In Example 7, a top gate/top contact field-effect transistor presented in FIG. 5 was produced. Here, numerical references presented in the following Examples correspond to the numerical references in FIG. 5.

Regarding the electric characteristics, the same evaluation as described in Example 1 was performed and results are presented in Table 2. The work function was not evaluated because the oxide region was disposed under the metal region.

<<Formation of Active Layer>>

On the substrate, a film of W-doped $Y_{0.6}In_{1.4}O_3$ was formed through a RF magnetron sputtering method so as to have a film thickness of 50 nm. When the active layer was formed through sputtering, a polycrystalline sintered body having a constitution of $Y_{0.6}In_{1.39}W_{0.01}O_3$ was used as a target. An argon gas and an oxygen gas were introduced as sputtering gasses. A total pressure was fixed to 1.1 Pa and oxygen concentration was set to 10% by volume. On the formed W-doped $Y_{0.6}In_{1.4}O_3$, resist patterns were formed through photolithography and the resultant was subjected to etching to form an active layer 14 having a predetermined shape. In the thus-obtained active layer, In in $Y_{0.6}In_{1.39}W_{0.01}O_3$ underwent substitutional doping with W in a concentration of 0.7 mol %.

<<Formation of source electrode and drain electrode>>

—Stacking Treatment of Source Electrode and Drain Electrode—

On the substrate 11 and the active layer 14, a Ti—Nb alloy target (Ti:Nb=98:2 (atomic ratio)) was used to continuously deposit films of an oxide region 12B, an oxide region 13B, a metal region 12A, and a metal region 13A through a reactive sputtering method to form a source electrode 12 and a drain electrode 13. The above method will be described hereinafter.

An argon gas and an oxygen gas were introduced as sputtering gasses. A Nb-doped titanium oxide film to be oxide regions was formed so as to have a thickness of 5 nm. A total pressure was fixed to 1.1 Pa and oxygen concentration was set to 10% by volume. Here, the titanium oxide film has good electric conductivity even if it does not satisfy the stoichiometric composition ratio. Subsequently, using an argon gas alone introducing as a sputtering gas, the same Ti—Nb alloy target was used to form a film of Ti—Nb so as to have a thickness of 100 nm. A sufficient pre-sputtering was performed so as to make oxidation states of the target surface uniform before each of the regions was formed.

Patterning was performed through a metal mask to form each film. Then, an oxide region 12B, an oxide region 13B, a metal region 12A, and a metal region 13A each having a predetermined shape were formed on the substrate 11.

<<Formation of Gate Insulating Layer>>

Next, a gate insulating layer 15 was formed by forming a film of $SiO_2$ through a sputtering method so as to have a thickness of 200 nm.

<<Formation of Gate Electrode>>

Finally, an Al film was formed on the gate insulating layer 15 through a sputtering method so as to have a thickness of 100 nm. On the formed Al film, resist patterns were formed through photolithography and the resultant was subjected to etching to form a gate electrode 16 having a predetermined shape. Subsequently, the film was subjected to an annealing treatment using an oven for 1 hour at 300 degrees Celsius in the air. This annealing treatment is generally performed in order to improve transistor characteristics by decreasing interface defect density between the active layer and the gate insulating layer.

As described above, a top gate/bottom contact field-effect transistor presented in FIG. 5 was completed.

Example 8

<Production of Field-Effect Transistor>

In Example 8, a top gate/top contact field-effect transistor was produced in the same manner as in Example 7 except that the —Stacking treatment of source electrode and drain electrode— and the <<Formation of active layer>> in Example 7 were changed to the below-described methods.

Regarding the electric characteristics, the same evaluation as described in Example 1 was performed and results are presented in Table 2. The work function was not evaluated because the oxide region was disposed under the metal region.

—Stacking Treatment of Source Electrode and Drain Electrode—

An oxide region 12B, an oxide region 13B, a metal region 12A, and a metal region 13A were formed in the same manner as in the production steps of the field-effect transistor in Example 7 except that the target was changed to a V-W alloy target (V:W=98:2 (atomic ratio)) to be oxide regions to form an oxide region 12B, an oxide region 13B, a metal region 12A, and a metal region 13A.

<<Formation of Active Layer>>

A film of an active layer was formed in the same manner as in the production steps of the field-effect transistor of Example 7 except that the sintered body target for forming the active layer was changed as described in Table 2.

Example 9

<Production of Field-Effect Transistor>

In Example 9, a top gate/top contact field-effect transistor was produced in the same manner as in Example 7 except that the —Stacking treatment of source electrode and drain electrode— in Example 7 was changed to the below-described method.

Regarding the electric characteristics, the same evaluation as described in Example 1 was performed and results are presented in Table 2. The work function was not evaluated because the oxide region was disposed under the metal region.

—Stacking Treatment of Source Electrode and Drain Electrode—

In the production steps of the field-effect transistor in Example 7, a film of Nb-doped $TiO_2$ was formed through a DC magnetron sputtering method so as to have a thickness of 5 nm. When the oxide regions were formed through sputtering, a polycrystalline sintered body having a constitution of $Ti_{0.9}Nb_{0.1}O_2$ was used as a target. An argon gas and an oxygen gas were introduced as sputtering gasses. A total pressure was fixed to 1.1 Pa and oxygen concentration was set to 1% by volume.

Subsequently, a film of Ti—Nb to be metal regions was formed so as to have a thickness of 100 nm using a Ti—Nb alloy target. An argon gas alone was used as a sputtering gas. Patterning was performed through a metal mask to form each film. Then, an oxide region 12B, an oxide region 13B, a metal region 12A, and a metal region 13A each having a predetermined shape were formed.

Example 10

<Production of Field-Effect Transistor>

In Example 10, a top gate/top contact field-effect transistor presented in FIG. 6 was produced. Here, numerical references presented in the following Examples correspond to the numerical references in FIG. 6. The same evaluations as described in Example 1 were performed. Results are presented in Table 3.

<<Formation of Active Layer>>

Next, on a substrate, a film of W-doped $MgIn_2O_4$ was formed through a RF magnetron sputtering method so as to have a film thickness of 50 nm. When the active layer was formed through sputtering, a polycrystalline sintered body having a constitution of $MgIn_{1.99}W_{0.01}O_4$ was used as a target. An argon gas and an oxygen gas were introduced as sputtering gasses. A total pressure was fixed to 1.1 Pa and oxygen concentration was set to 50% by volume to form an excessively oxidized active layer. On the formed W-doped $MgIn_2O_4$, resist patterns were formed through photolithography and the resultant was subjected to etching to form an active layer 14 having a predetermined shape. In the thus-obtained active layer, In in $MgIn_2O_4$ underwent substitutional doping with W in a concentration of 0.5 mol %.

<<Formation of Source Electrode and Drain Electrode>>

—Formation of Source Electrode Precursor and Drain Electrode Precursor—

On the substrate 11 and the active layer 14, a film of Mo was formed so as to have a thickness of 100 nm through a sputtering method. Patterning was performed through a metal mask to form each film. A metal layer (source electrode precursor) and a metal layer (drain electrode precursor) each having a predetermined shape were formed on the substrate 11 and the active layer 14.

—Oxidation Treatment—

The metal layer (source electrode precursor) and the metal layer (drain electrode precursor) formed were subjected to a heat treatment in an oven in the air at 200 degrees Celsius to form oxide regions 12B and 13B on regions that are in contact with the active layer.

<<Formation of Gate Insulating Layer>>

Next, a gate insulating layer 15 was formed by forming a film of $SiO_2$ so as to have a thickness of 200 nm through a sputtering method.

<<Formation of Gate Electrode>>

Finally, an Al film was formed on the gate insulating layer 15 through a sputtering method so as to have a thickness of 100 nm. On the formed Al film, resist patterns were formed through photolithography and the resultant was subjected to etching to form a gate electrode 16 having a predetermined shape. Subsequently, the film was subjected to an annealing treatment using an oven for 1 hour at 300 degrees Celsius in the air. This annealing treatment is generally performed in order to improve transistor characteristics by decreasing interface defect density between the active layer and the gate insulating layer.

As described above, a top gate/top contact field-effect transistor presented in FIG. 6 was completed.

Examples 11 to 12

<Production of Field-Effect Transistor>

In Examples 11 to 12, a top gate/bottom contact field-effect transistor was produced in the same manner as in Example 10 except that the —Formation of source electrode precursor and drain electrode precursor—in Example 10 was changed to the below-described method.

The same evaluations as described in Example 1 were performed. Results are presented in Table 3.

—Formation of Source Electrode Precursor and Drain Electrode Precursor—

A metal layer 2 and a metal layer 3 were formed in the same manner as in the production steps of the field-effect transistor in Example 10 except that the target for forming the metal layer was changed to each target described in Table 3.

Examples 13 to 14

<Production of Field-Effect Transistor>

In Examples 13 to 14, a top gate/bottom contact field-effect transistor was produced in the same manner as in Example 10 except that the —Formation of source electrode precursor and drain electrode precursor—and the <<Formation of active layer>> in Example 10 were changed to the below-described methods.

The same evaluations as described in Example 1 were performed. Results are presented in Table 3.

—Formation of Source Electrode Precursor and Drain Electrode Precursor—

A metal layer 2 and a metal layer 3 were formed in the same manner as in the production steps of the field-effect transistor in Example 10 except that the target used for forming the metal layer was changed to each target presented in Table 3.

<<Formation of Active Layer>>

A film of an active layer was formed in the same manner as in the production steps of the field-effect transistor in Example 10 except that the sintered body target for forming the active layer was changed to each target described in the following Table 3.

Comparative Example 1

<Production of Field-Effect Transistor>

A top gate/bottom contact field-effect transistor presented in FIG. 20 was produced in the same manner as in Example 1 except that the oxidation treatment of the source electrode and the drain electrode in Example 1 was omitted. In FIG. 20, the numerical reference 112 is a source electrode and the numerical reference 113 is a drain electrode.

The same evaluations as described in Example 1 were performed. Results are presented in Table 1.

Here, as a result of evaluation of transistor performances, high electric current flowed in a state that gate voltage was not applied and switching did not arise. Therefore, the calculated on/off ratio was $10^1$.

Comparative Example 2

<Production of Field-Effect Transistor>

A top gate/top contact field-effect transistor presented in FIG. 21 was produced in the same manner as in Example 7 except that the stacking treatment of the source electrode and the drain electrode in Example 7 was omitted.

The same evaluations as described in Example 1 were performed. Results are presented in Table 2.

Here, as a result of evaluation of transistor performances, high electric current flowed in a state that gate voltage was not applied and switching did not arise. Therefore, the calculated on/off ratio was $10^1$.

Comparative Example 3

<Production of Field-Effect Transistor>

A top gate/top contact field-effect transistor presented in FIG. 6 was produced in the same manner as in Example 10 except that the <<Formation of active layer>> was changed as described below and the oxidation treatment was omitted.

The same evaluations as described in Example I were performed. Results are presented in Table 3.

Here, as a result of evaluation of transistor performances, high electric current flowed in a state that gate voltage was not applied and switching did not arise. Therefore, the calculated on/off ratio was $10^1$.

<<Formation of Active Layer>>

A film of W-doped $MgIn_2O_4$ was formed on the substrate through a RF magnetron sputtering method so as to have a film thickness of 50 nm. When the active layer was formed through sputtering, a polycrystalline sintered body having a constitution of $MgIn_{1.99}W_{0.01}O_4$ was used as a target. An argon gas and an oxygen gas were introduced as sputtering gasses. A total pressure was fixed to 1.1 Pa and oxygen concentration was set to 10% by volume. On the formed W-doped $MgIn_2O_4$, resist patterns were formed through photolithography and the resultant was subjected to etching to form an active layer 14 having a predetermined shape. In the thus-obtained active layer, In in $MgIn_2O_4$ underwent substitutional doping with W in a concentration of 0.5 mol %.

TABLE 1

|  | Configuration of source electrode and drain electrode | | Treatment method of source electrode and drain electrode | Surface work function of source electrode and drain electrode [eV] | Target for forming active layer | Oxygen gas concentration in formation of active layer | Transistor characteristics (on/off ratio) |
| --- | --- | --- | --- | --- | --- | --- | --- |
|  | First layer | Second layer | | | | | |
| Example 1 | Mo | Al | Heat treatment | 5.4 | $MgIn_2O_4$ | 2.5% by volume | $10^8$ |
| Example 2 | V | Al | Plasma treatment | 5.4 | $Y_{0.6}In_{1.4}O_3$ | 2.5% by volume | $10^8$ |
| Example 3 | Ti | Al | Heat treatment | 5.5 | $MgIn_{1.99}W_{0.01}O_4$ | 10% by volume | $10^8$ |
| Example 4 | Ti—Ta | Al | Heat treatment | 5.4 | $MgIn_{1.99}W_{0.01}O_4$ | 10% by volume | $10^9$ |
| Example 5 | Ti—W | Al | Plasma treatment | 5.4 | $Y_{0.6}In_{1.39}W_{0.01}O_3$ | 10% by volume | $10^9$ |
| Example 6 | V—W | Al | Plasma treatment | 5.2 | $Y_{0.6}In_{1.39}W_{0.01}O_3$ | 10% by volume | $10^9$ |
| Comparative Example 1 | Mo | Al | No treatment | 4.6 | $MgIn_2O_4$ | 10% by volume | $10^1$ |

Alloy target (Ti—Ta) of Example 4: (Ti:Ta = 98:2 (atomic ratio))
Alloy target (Ti—W) of Example 5: (Ti:W = 98:2 (atomic ratio))
Alloy target (V—W) of Example 6: (V:W = 98:2 (atomic ratio))

Alloy target (Ti—Ta) of Example 4: (Ti:Ta=98:2 (atomic ratio))
Alloy target (Ti—W) of Example 5: (Ti:W=98:2 (atomic ratio))
Alloy target (V—W) of Example 6: (V:W=98:2 (atomic ratio))

TABLE 2

|  | Configuration of source electrode and drain electrode (metal region) | Treatment method of source electrode and drain electrode | Target for forming active layer | Oxygen gas concentration in formation of active layer | Transistor characteristics (on/off ratio) |
| --- | --- | --- | --- | --- | --- |
| Example 7 | Ti—Nb | Stacking treatment (reactive sputtering using the same alloy target) | $Y_{0.6}In_{1.39}W_{0.01}O_3$ | 10% by volume | $10^9$ |

TABLE 2-continued

| | Configuration of source electrode and drain electrode (metal region) | Treatment method of source electrode and drain electrode | Target for forming active layer | Oxygen gas concentration in formation of active layer | Transistor characteristics (on/off ratio) |
|---|---|---|---|---|---|
| Example 8 | V—W | Stacking treatment (reactive sputtering using the same alloy target) | $MgIn_{1.99}W_{0.01}O_4$ | 10% by volume | $10^9$ |
| Example 9 | Ti—Nb | Stacking treatment (oxide target + alloy target) | $Y_{0.6}In_{1.39}W_{0.01}O_3$ | 10% by volume | $10^9$ |
| Comparative Example 2 | Ti—Nb | No treatment | $Y_{0.6}In_{1.39}W_{0.01}O_3$ | 10% by volume | $10^1$ |

TABLE 3

| | Configuration of source electrode and drain electrode (metal region) | Treatment method of source electrode and drain electrode | Surface work function of source electrode and drain electrode [eV] | Target for forming active layer | Oxygen gas concentration in formation of active layer | Transistor characteristics (on/off ratio) |
|---|---|---|---|---|---|---|
| Example 10 | Mo | Heat treatment | 5.4 | $MgIn_{1.99}W_{0.01}O_4$ | 50% by volume | $10^8$ |
| Example 11 | Ti | Heat treatment | 5.4 | $MgIn_{1.99}W_{0.01}O_4$ | 50% by volume | $10^8$ |
| Example 12 | Ti—Nb | Heat treatment | 5.6 | $MgIn_{1.99}W_{0.01}O_4$ | 50% by volume | $10^9$ |
| Example 13 | V | Heat treatment | 5.4 | $Y_{0.6}In_{1.39}W_{0.01}O_3$ | 50% by volume | $10^8$ |
| Example 14 | Ti—V | Heat treatment | 5.3 | $Y_{0.6}In_{1.39}W_{0.01}O_3$ | 50% by volume | $10^9$ |
| Comparative Example 3 | Mo | No treatment | 4.6 | $MgIn_{1.99}W_{0.01}O_4$ | 10% by volume | $10^1$ |

Alloy target (Ti—Nb) of Example 12: (Ti:Nb = 98:2 (atomic ratio))
Alloy target (Ti—V) of Example 14: (Ti:V = 98:2 (atomic ratio))

Alloy target (Ti—Nb) of Example 12: (Ti:Nb=98:2 (atomic ratio))

Alloy target (Ti—V) of Example 14: (Ti:V=98:2 (atomic ratio))

From Table 1, as comparing the work functions of Examples 1 to 6 with the work function of Comparative Example 1, it is found that the work function values of Examples 1 to 6 were large and the surface-oxidized layers were formed on the surfaces of the source electrode and the drain electrode. At this time, in Examples 1 to 3, a concentration of oxygen gas, which was introduced when the film formation of the active layer was performed, is optimized to form the oxygen regions on the surfaces of the source electrode and the drain electrode. As a result, it is possible to obtain high transistor characteristics (on/off ratio) with the carrier concentration being maintained. Meanwhile, in Comparative Example 1, there is no oxidized layer beforehand on the surfaces of the source electrode and the drain electrode, which results in oxidation of the electrodes at the interface between the active layer and the source electrode and the interface between the active layer and the drain electrode. As a result, high electric current flows even when the gate voltage is not applied, resulting in a normally-on field-effect transistor. The reason for this is as follows. Specifically, oxygen excessively moved outside the active layer (i.e., the oxide semiconductor was reduced). As a result, a carrier attributed to the generated oxygen vacancies induced increasing of the carrier concentration of the oxide semiconductor, which was larger than the carrier concentration optimized under the conditions of the film formation, resulting in the active layer having low resistance.

The field-effect transistors of Examples 4 to 6 have a value of the on/off ratio higher by one digit than in Examples 1 to 3. The reason for this is as follows. That is, the oxides formed on the source electrode and the drain electrode underwent substitutional doping to increase electric conductivity (i.e., decrease in resistivity). As a result, contact resistivity was decreased at the interface between the source electrode and the active layer and the interface between the drain electrode and the active layer. Accordingly, when the oxide undergoing the substitutional doping is formed between the source electrode and the active layer and between the drain electrode and the active layer, more favorable contact can be obtained.

From Table 2, comparison between Examples 7 to 9 and Comparative Example 2 indicates that the same tendency can be obtained. This is because the oxide region formed through the stacking treatment served as a reduction preventing layer for the active layer, which inhibited an amount of the oxygen vacancies generated in the active layer.

From Table 3, comparison between Examples 10 to 14 and Comparative Example 3 indicates that the same tendency can be obtained. The reason for this is as follows. By excessively supplying oxygen gas concentration introduced upon performing film formation of the active layer, even when the oxide regions were formed on the source electrode and the drain electrode through the heating in the oxidation treatment, the oxygen vacancies were not a dominant factor of the carrier generation mechanism in the active layer, which could prevent deterioration of the characteristics. Here, even in a state that the oxygen vacancies are inhibited, the active layer functioned to exhibit switching operation. This is because carriers are generated by the substitutional doping. In Comparative Example 3, a concentration of oxygen gas introduced upon performing film formation of the active layer was not excessive. Therefore, when oxidation of the electrodes arose at the interface at the interface between the source electrode and the active layer and the interface between the drain electrode and the active layer, the oxide semiconductor of the active layer was reduced to decrease the resistivity and flow high electric current in a state that gate voltage was not applied. As described above, when there is no oxide region between the source electrode and the active layer and between the drain electrode and the active layer beforehand, the electric characteristics of the active layer will be affected. Therefore, in order to form the oxide regions as described in Examples 10 to 14, it is necessary to change the conditions for forming the active layer to form the oxide regions.

Aspects of the present disclosure are as follows.

<1> A field-effect transistor including:

a gate electrode, which is configured to apply gate voltage;

a source electrode and a drain electrode, which are configured to take electric current out;

an active layer, which is disposed between the source electrode and the drain electrode and is formed of an oxide semiconductor; and a gate insulating layer, which is disposed between the gate electrode and the active layer, wherein the source electrode and the drain electrode each include a metal region formed of a metal and an oxide region formed of one or more metal oxides, and wherein a part of the oxide region in each of the source electrode and the drain electrode is in contact with the active layer, and rest of the oxide region is in contact with one or more components other than the active layer.

<2> The field-effect transistor according to <1>, wherein oxygen concentration in a region of the oxide region in each of the source electrode and the drain electrode decreases toward the metal region, the region of the oxide region in each of the source electrode and the drain electrode being in contact with the active layer.

<3> The field-effect transistor according to <1> or <2>, wherein the metal is a simple substance of a transition metal or an alloy thereof.

<4> The field-effect transistor according to any one of <1> to <3>, wherein the metal includes at least one selected from the group consisting of Ti, V, Nb, Ta, Mo, and W.

<5> The field-effect transistor according to any one of <1> to <4>, wherein the source electrode and the drain electrode each have a stacked structure of a first layer and a second layer, the first layer including the metal region and the oxide region and the second layer being formed of a metal.

<6> The field-effect transistor according to <1> or <2>, wherein the oxide includes a transition metal having a positive valence and a substitutional dopant having a positive valence larger than the positive valence of the transition metal, and wherein the metal includes an element of the transition metal and an element serving as a dopant with respect to the oxides.

<7> The field-effect transistor according to <6>, wherein the element of the transition metal includes at least one selected from the group consisting of Ti, V, Nb, Ta, Mo, and W.

<8> The field-effect transistor according to <6> or <7>, wherein the element serving as a dopant with respect to the oxides includes at least one selected from the group consisting of V, Nb, Ta, Cr, Mo, W, Mn, and Re.

<9> The field-effect transistor according to any one of <1> to <8>, wherein the oxide semiconductor includes at least one selected from the group consisting of In, Zn, Sn, and Ti.

<10> The Field-Effect Transistor According to <9>, wherein the oxide semiconductor includes at least one of alkaline earth elements.

<11> The field-effect transistor according to <9>, wherein the oxide semiconductor includes at least one of rare earth elements.

<12> The field-effect transistor according to <9>, wherein the oxide semiconductor is an n-type oxide semiconductor and undergoes a substitutional doping with at least one dopant selected from the group consisting of a bivalent cation, a trivalent cation, a tetravalent cation, a pentavalent cation, a hexavalent cation, a heptavalent cation, and an octavalent cation, and wherein a valence of the dopant is larger than a valence of a metal ion constituting the oxide semiconductor, provided that the dopant is excluded from the metal ion.

<13> A method for producing the field-effect transistor according to any one of <1> to <12>, the method including forming the source electrode, the drain electrode, and the active layer so that a part of the oxide region in each of the source electrode and the drain electrode is in contact with the active layer.

<14> The method for producing the field-effect transistor according to <13>, wherein the forming the source electrode, the drain electrode, and the active layer includes:

a treatment of oxidizing a surface of a metal layer to form the source electrode and the drain electrode each having the metal region and the oxide region; and a treatment of forming the active layer so as to be in contact with the part of the oxide region in each of the source electrode formed and the drain electrode formed.

<15> The method for producing the field-effect transistor according to <13>, wherein the forming the source electrode, the drain electrode, and the active layer includes:

a treatment of forming the active layer; and a treatment of forming the oxide region so that the part of the oxide region is in contact with the active layer formed and further forming the metal region on the oxide region to form the source electrode and the drain electrode each including the oxide region and the metal region.

<16> The method for producing the field-effect transistor according to <13>, wherein the forming the source electrode, the drain electrode, and the active layer includes:

a treatment of forming the active layer;

a treatment of forming a metal layer so that a part of the metal layer is in contact with the active layer formed; and a treatment of oxidizing a surface of the metal layer to form the source electrode and the drain electrode each including the metal region and the oxide region so that the part of the oxide region is in contact with the active layer formed.

<17> The method for producing the field-effect transistor according to any one of <13> to <16>,
wherein oxygen concentration in a region of the oxide region in each of the source electrode and the drain electrode decreases toward the metal region, the region of the oxide region in each of the source electrode and the drain electrode being in contact with the active layer.

<18> The method for producing the field-effect transistor according to any one of <13> to <17>,
wherein the metal is a simple substance of a transition metal or an alloy thereof.

<19> The method for producing the field-effect transistor according to any one of <13> to <16>,
wherein the oxide includes a transition metal having a positive valence and a substitutional dopant having a positive valence larger than the positive valence of the transition metal, and
wherein the metal includes an element of the transition metal and an element serving as a dopant with respect to the oxides.

<20> A display element including:
an optical control element configured to control light output according to a driving signal; and
a driving circuit including the field-effect transistor according to any one of <1> to <12> and configured to drive the optical control element.

<21> The display element according to <20>,
wherein the optical control element includes an organic electroluminescent element, an electrochromic element, a liquid crystal element, an electrophoretic element, or an electrowetting element.

<22> An image display device configured to display an image corresponding to image data, the image display device including:
a plurality of display elements arranged in a form of matrix, each of the plurality of display elements being the display element according to <20> or <21>;
a plurality of wires configured to individually apply gate voltage and signal voltage to the field-effect transistors in the plurality of display elements; and
a display control device configured to individually control the gate voltage and the signal voltage of the field-effect transistors via the plurality of wires correspondingly to the image data.

<23> A system including:
the image display device according to <22>; and
an image-data-generating device configured to generate image data based on image information to be displayed and to output the image data to the image display device.

REFERENCE SIGNS LIST 2 metal layer
3 metal layer
10 field-effect transistor
11 substrate
12 source electrode
12A metal region
12B oxide region
13 drain electrode
13A metal region
13B oxide region
14 active layer
15 gate insulating layer
16 gate electrode
17 interlayer insulating layer
18 data lines
20 field-effect transistor
22 active layer
23 source electrode
24 drain electrode
25 gate insulating layer
26 gate electrode
40 field-effect transistor
302, 302' display element
310 display
320, 320' drive circuit
370 liquid crystal element
400 display control device

The invention claimed is:

1. A field-effect transistor, comprising:
a source electrode;
a drain electrode; and
an active layer formed of an oxide semiconductor,
wherein the source electrode and the drain electrode each comprise a metal region comprising a metal and an oxide region comprising a metal oxide,
wherein a part of the oxide region in each of the source electrode and the drain electrode is in contact with the active layer,
wherein a remainder of the oxide region is in contact with one or more components other than the active layer,
wherein an oxygen concentration in a region of the oxide region in each of the source electrode and the drain electrode decreases toward the metal region,
wherein the region of the oxide region in each of the source electrode and the drain electrode is in contact with the active layer,
wherein the metal oxide comprises a transition metal having a positive valence and a substitutional dopant having a positive valence larger than the positive valence of the transition metal,
wherein the metal comprises the transition metal and an element serving as a dopant with respect to the oxide, the dopant comprising: V, Nb, Ta, Cr, Mo, W, Mn, and/or Re.

2. The transistor of claim wherein the metal is a transition metal or an alloy thereof.

3. The transistor of claim 1, wherein the metal comprises Ti, V, Nb, Ta, Mo, and/or W.

4. The transistor of claim 1, wherein the source electrode and the drain electrode each have a stacked structure comprising a first layer and a second layer,
wherein the first layer comprises the metal region and the oxide region and the second layer being formed of a metal.

5. The transistor of claim 1, wherein the transition metal comprises Ti, V, Nb, Ta, Mo, and/or W.

6. The transistor of claim 1, wherein the dopant comprises Nb and/or W.

7. The transistor of claim 1, wherein the oxide semiconductor comprises In, Zn, Sn, and/or Ti.

8. The transistor of claim 7, Wherein the oxide semiconductor comprises an alkaline earth element.

9. The transistor of claim 7, wherein the oxide semiconductor comprises a rare earth element.

10. The transistor of claim 7, wherein the oxide semiconductor is a n-type oxide semiconductor and undergoes a substitutional doping with a dopant comprising a bivalent cation, a trivalent cation, a tetravalent cation, a pentavalent cation, a hexavalent cation, a heptavalent cation, and/or octavalent cation, and wherein a valence of the dopant is larger than a valence of a metal ion constituting the oxide semiconductor, and the dopant is excluded from the metal ion.

11. A method for producing the transistor of claim 1, the method comprising:
forming the source electrode, the drain electrode, and the active layer so that a part of the oxide region in each of the source electrode and the drain electrode is in contact with the active layer.

12. The method of claim 11 wherein the forming comprises:
oxidizing a surface of a metal layer to form the source electrode and the drain electrode each having the metal region and the oxide region; and
forming the active layer so as to be in contact with the part of the oxide region in each of the source electrode formed and the drain electrode formed.

13. The method of claim 11, wherein the forming the source electrode, the drain electrode, and the active layer comprises:
forming the active layer; and
forming the oxide region so that the part of the oxide region is in contact with the active layer formed and further forming the metal region on the oxide region to form the source electrode and the drain electrode each including the oxide region and the metal region.

14. The method of claim 11, wherein the forming the source electrode, the drain electrode, and the active layer comprises:
forming the active layer;
forming a metal layer so that a part of the metal layer is in contact with the active layer formed; and
oxidizing a surface of the metal layer to form the source electrode and the drain electrode each including the metal region and the oxide region so that the part of the oxide region is in contact with the active layer formed.

15. A display element, comprising:
an optical control element configured to control light output according to a driving signal; and
a driving circuit comprising the transistor of claim 1 and configured to drive the optical control element.

16. The display element of claim 15, wherein the optical control element comprises an organic electroluminescent element, an electrochromic element, a liquid crystal element, an electrophoretic element, or an electrowetting element.

17. An image display device configured to display an image corresponding to image data, the image display device comprising:
a plurality of display elements arranged in a form of matrix, each of the plurality of display elements being the display element of claim 15;
a plurality of wires configured to individually apply gate voltage and signal voltage to the field-effect transistors in the plurality of display elements, and
a display control device configured to individually control the gate voltage and the signal voltage of the field-effect transistors via the plurality of wires correspondingly to the image data.

18. A system, comprising:
the image display device of claim 17; and
an image-data-generating device configured to generate image data based on image information to be displayed and to output the image data to the image display device.

19. The transistor of claim 1, wherein the metal comprises V, Nb, Ta, and/or W.

* * * * *